United States Patent [19]

Bolger

[11] Patent Number: 5,667,884

[45] Date of Patent: Sep. 16, 1997

[54] AREA BONDING CONDUCTIVE ADHESIVE PREFORMS

[76] Inventor: Justin C. Bolger, 27 Rolling La., Dover, Mass. 02030

[21] Appl. No.: 226,715

[22] Filed: Apr. 12, 1994

Related U.S. Application Data

[63] Continuation-in-part of Ser. No. 47,141, Apr. 12, 1993, abandoned.

[51] Int. Cl.$^6$ ............................................. B32B 5/16
[52] U.S. Cl. ..................... 428/323; 156/47; 156/320; 156/330; 428/328; 428/343; 428/356; 428/355 EP
[58] Field of Search ........................... 252/572; 156/47, 156/320, 330; 428/560, 323, 328, 343, 355, 356

[56] References Cited

U.S. PATENT DOCUMENTS

| | | | |
|---|---|---|---|
| 4,012,832 | 3/1977 | Crane | 29/575 |
| 5,136,365 | 8/1992 | Pennisi | 357/72 |
| 5,147,210 | 9/1992 | Patterson et al. | 439/91 |
| 5,187,020 | 2/1993 | Kwon | 428/601 |
| 5,201,974 | 4/1993 | West | 156/47 |
| 5,252,255 | 10/1993 | Moy et al. | 252/512 |

FOREIGN PATENT DOCUMENTS

| | | |
|---|---|---|
| 0 134 606 | 3/1985 | European Pat. Off. . |
| 0 265 077 | 4/1988 | European Pat. Off. . |
| 0 275 433 | 7/1988 | European Pat. Off. . |
| 0 372 880 | 6/1990 | European Pat. Off. . |
| 3414961 | 10/1984 | Germany . |
| 2 248 450 | 4/1992 | United Kingdom . |

*Primary Examiner*—H. Thi Le
*Attorney, Agent, or Firm*—Bruce F. Jacobs

[57] ABSTRACT

Electrically conductive sheet material preforms useful in bonding of electronic components as well as in the formation of electronic circuits are disclosed. The preforms, which comprise a multiplicity of electrically conductive adhesive members, each being separated from each other by means of a non-electrically conductive adhesive, are particularly useful in the assembly of multi-chip modules and other electronic devices.

14 Claims, 6 Drawing Sheets

AREA BONDING CONDUCTIVE ADHESIVE PREFORMS

This application is a continuation-in-part of U.S. application Ser. No. 08/047,141, filed Apr. 12, 1993, now abandoned.

BACKGROUND OF THE INVENTION

In the construction of many electronic devices, it is necessary to form a large number of electrical connections between two closely spaced parallel surfaces. For example, this occur with flipped chips attached to multi-layer substrates in the construction of multi-chip modules (MCM's), in forming interlayer connections in circuit boards or in LCD display panels, in surface mounting of pad array chip carriers which have a grid array of contact pads on the bottom surface where each of the individual pads must be electrically connected to a corresponding conductive pad on the mother board or other mounting surface, and the like.

The number of contact points which must be formed, per unit area, between two opposing parallel surfaces, is called the "interconnect density." The interconnect density has been increasing rapidly in recent years. In the early 1980's, contacts within or at the base of circuit boards or other components were generally spaced on 100 mil "pitch", i.e. with center-to center spacing of 0.100" (about 2.5 mm) [1 mm=39.4 mils], yielding an interconnect density of 100 contacts per square inch. In 1993, the physical contacts have become smaller and the distance between contacts reduced to 10 mils and often less. Thus the interconnect density has increased to 10,000 or more per square inch.

The most widely used method to make the higher density closely spaced interconnects is by soldering, usually by a tin-lead alloy solder. Soldering requires that the electrical contact areas on the surfaces being joined be "wettable" by the solder when it is molten so that the cooled solder will adhere thereto. Generally this is done by causing the areas at which electrical interconnects are needed to have a surface of a wettable metal such as an oxide-free copper, gold, or other suitable metal, and to have the wettable metallic areas surrounded by non-wettable areas of, for example, an oxide or polymer to which the solder will not adhere. When solder is melted between the two opposing surfaces, surface tension pulls the molten metal into droplets which contact only the wettable metal contact areas and insures that there is no solder, and therefore no electrical contact after cooling, between adjacent solder "bumps" or balls. After cooling, the contact areas are electrically connected across the space between the two surfaces by the solder bumps. Hence, a large number of closely spaced contacts can be established. Solder bumps 4 to 5 mils in diameter on 10 mil centers can therefore satisfy the current requirements for up to $10^4$ individual contacts per square inch.

There are, however, many problems with the use of tin-lead solders. The lead is toxic. The fluxes and cleaning solvents used are environmental hazards. The formation of wettable and non-wettable areas on surfaces is expensive and time consuming. Tin-lead solder is relatively brittle and provides little shock resistance. If the two opposing surfaces differ in coefficient of thermal expansion, a solder-bump assembly may suffer cracking (hence electrical failure) of individual solder bumps when the assembly is cooled. While solder bumps are useful to attach silicon dies to ceramic or silicon multi-chip modules (MCM-C's or MCM-D's), the thermal expansion issue has generally precluded using solder to attach silicon dies to laminated Kapton/copper multi-chip modules (MCM-L's) or to other copper-plastic laminated circuit boards. Kapton is a Dupont polyimide film.

Attempts to avoid the use of tin-lead solder bump interconnections have included the development of anisotropic "Z-axis" polymeric adhesives. A Z-axis adhesive is intended to join two horizontal surfaces in a manner which conducts electricity vertically between the two surfaces (the Z axis) only in desired contact areas while not conducting electricity between contact points in the horizontal plane of the adhesive (the X and Y axes). Most currently used anisotropic adhesives consist of random dispersions of metal particles (often gold-plated nickel spheres) in a flexible polymeric film. Electrical conductivity in the X-Y plane is prevented by using a very low metal particle loading. When the flexible film is compressed between two opposing conductors, it is hoped that a sufficient number of individual metal particles will form the necessary electrical connections. Most Z-axis adhesives require (i) heat to cause the polymer phase to flow, wet, and cure, and (ii) pressure to force and hold the surfaces in contact. When the film is placed between two surfaces under heat and pressure, the polymer bonds to the surfaces and the particles are forced into contact, establishing conductivity in the Z-axis only. In an attempt to avoid using heat, other Z-axis systems depending only on mechanical forces to maintain contact have been suggested. Spitz, S. L., *Electronic Packaging and Production*, p. 12, Sep. 1989, has described a method in which spring-loaded metal clips are used to maintain pressure across a sheet of silicone rubber which is randomly loaded with conductive metal particles. Substantial pressure is needed to establish and to maintain the electrical contacts, relying on mechanical forces and not a true chemical bond between the conductive metal particles and the contact pads. Whether heat is used or not, the number of metal particles per unit area must be relatively small to prevent accidental conductivity in the X or Y direction and thus the Z-axis conductivity must also be small.

In an attempt to improve the performance of Z-axis systems and provide interfacial electrical contact at specific points, rather than relying on possibility of contact due to randomly dispersed conductive metal balls, the preparation of Z-axis connectors having conductive regions precisely located on stripes or dots separated by non-conductive regions has been suggested. Bochoff, L., "Guidelines for Designing Elastomeric Connectors," Connection Technology, 1987, and Reinke, R. R., "Interconnective Method of LCD LSI's using Anisotropic Conductive Film Connectors," Proceedings 1991 Electronic Components and Technology Conference, IEEE, 1991, p. 355, have described "zebra stripe" or "multiple dot" connectors which are generally made by forming regions of electrically conductive (carbon powder-filled) silicone rubber within regions of non-electrically conductive silicone rubber (no carbon powder). Although these silicone rubber connectors are in commercial use, they depend on pressure to hold the conductive region of a cured conductive elastomer against an opposite contact surface. In addition, the carbon-filled dots and zebra stripes inherently have relatively low electrical conductivity, a level adequate for simple LCD displays, for low cost wristwatches and calculators and the like, but inadequate for many high performance devices.

Another attempt at avoiding the limitations of the above Z-axis adhesives is disclosed in U.S. Pat. No. 4,548,862 in which conductivity between two surfaces is provided at specific (rather than random) points. This is done by filling a flexible pressure-sensitive adhesive film with metal particles having a ferromagnetic core and a gold or silver plated electrically conductive surface. The particles are then oriented and concentrated in columns at specific points by use of a magnetic field, similar to the process used to make magnetic recording tape. The method results in low conductivity per contact point due to the low conductivity of the iron oxide filler particles.

A still further attempt to produce a Z-axis system and provide interfacial electrical contact, particularly for flip chip die attach, is that of Hogerton, P. B. et al, Material Research Society Symp. Proceedings, Vol 154, pp 415–24, 1989, in which nickel or nickel-gold plated polymeric balls are used to form "pressure engaged interconnectors" by inserting the plated 0.001" (1 mil) (25.4 micron) diameter polymeric balls in selected areas of a non-conductive epoxy adhesive and then compressing those particles. When the bonding process generates a sufficiently high pressure to compress the polymer particles to about 60% of initial size, then they can provide electrical conductivity in the Z-direction. It is reported that it takes about 10 such particles per electrical connection to have conductivity. Use of this concept requires the use of a highly complicated and expensive machine to compress the adhesive while maintaining both compression and exact planarity during the cure of the epoxy adhesive around the polymeric balls. The adhesive bond which is formed is only about 0.5 mil (12.7 micron) thick—too thin a layer to accommodate differences in thermal expansion between many materials. A significant loss in conductivity is reported when the adhesive bond experiences temperatures greater than about 70° C. and after long times under compression when the polymer particles "creep."

Accordingly, it is an object of the present invention to overcome the numerous disadvantages of the prior art interconnect methods and products used in an attempt to achieve high density interconnection.

It is a further object of this invention to form multiple layer circuits by relatively simple means.

It is a further object of this invention to form pad chip carriers without wire or solder bonds.

It is a further object of this invention to form solder-free laminated multi-chip modules.

These and still further objects will be apparent from the ensuing description and claims of this invention.

DISCLOSURE OF THE INVENTION

The present invention is directed to an adhesive sheet material comprising a multiplicity of electrically conductive adhesive members, each separated transversely from each other by a non-conductive adhesive region. The conductive adhesive members and non-conductive adhesive region are joined together to form an integral sheet material. The adhesive sheet material is initially formed on a release film from which it is readily removed during the manufacture of electronic components. Preferably, the sheet material is cut into premeasured shapes which generally correspond to the silicon die or other surface to which it is to be attached. Such pre-cut adhesive shapes are often referred to as "preforms" and are included within the definition of electrically conductive sheet material for the purposes of the present invention. The preforms may be of any desired shape, but generally will be rectangular or square. The conductive adhesive members are generally arranged in a pattern or an array to maximize their ability to achieve complete electrical contacts. Preferably, the conductive adhesive members are conical or dome-shaped members extending from above the top surface through to the bottom surface of the preform and are arranged in a pattern which corresponds to the size and location of the electrical contact pads on the surface of the die, chip carrier, multi-chip module, mounting board, circuit board, or other parts to be joined and electrically interconnected.

The preforms are useful for area bonding, that is they are useful to attach a silicon die or other electronic element or device having a number of conductive pads or contacts on one surface to a second electronic element or device also having conductive pads or contacts on at least one surface, such that: (i) the respective conductive pads or contacts on each of the two surfaces are maintained in electrical contact; (ii) the two surfaces are securely and permanently fastened to each other via cured adhesive bonds; (iii) after curing of the adhesives, no external force or pressure is required to maintain the attachment of the surfaces or the electrical contact between opposing bond pads; and (iv) there is no unintentional electrical contact between any two adjacent pads on either surface.

In contrast to prior art techniques, the present use of area bonding conductive adhesive preforms for bonding electrical component parts together uses no solder and requires no die bumping or any other die surface modification. No gold/nickel plating or solder masking or other preparation of the substrate mounting surface is required. The preforms of the present invention give a total area bond, in contrast to tin-lead solder bump connections which leave an air gap between solder bumps. Most importantly, for reliability and electrical performance purposes, the present preforms form a high conductivity (low ohmic resistance) chemical, i.e. adhesive, bond to the contact pads on the devices. After cure, the adhesive bonds require no external pressure or mechanical forces to maintain secure contact. Previous Z-axis adhesives which rely on metal balls or metal coated polymeric balls or on bumps or stripes of conductive rubber provide a lower electrical conductivity and must be held against the contact pads by spring clips or other external pressure devices or by shrinkage forces from the surrounding non-conductive adhesive.

The preforms are suitable for bonding to any surface, metallic or non-metallic. The conductive adhesive members form a chemical bond and reliable electrical connections to copper or to any other conductor. Another advantage of the preforms of the present invention is that they can be easily re-worked or repaired after removal by heating for several seconds at temperatures above about 200° C. Still another advantage is that the preforms eliminate the use of fluxes and cleaning solvents which are required with lead solder. As a result, the present preforms provide major environmental advantages as well as cost savings in the production of electronic components in which they are used and superior performance properties.

The electrically conductive sheet material of the present invention is easy to manufacture at relatively modest cost. Generally, the sheet material is produced by forming a multiplicity of conductive adhesive members on a release film. This is preferably accomplished by passing an electrically conductive adhesive paste through a screen or stencil or other suitable device to form a desired pattern. Then, a non-conductive adhesive is applied to the release film either directly or by passing it through a "reverse" screen or similar type device which is positioned and designed to block the non-conductive adhesive from covering the conductive adhesive members already positioned on the release film. The sheet material may then be dried and cut into suitable sizes and shapes to form the an adhesive preform. Alternatively, the non-conductive region may be deposited prior to the multiple conductive areas as shown in Example III below.

DETAILED DESCRIPTION OF THE PREFERRED EMBODIMENTS

Figure 1:
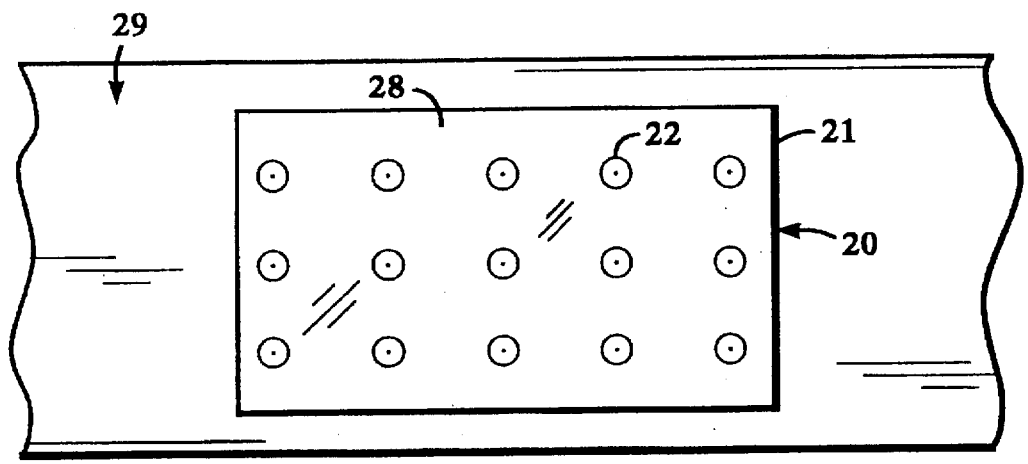
FIG. 1 is a top view of a preform of the present invention.
Figure 2:
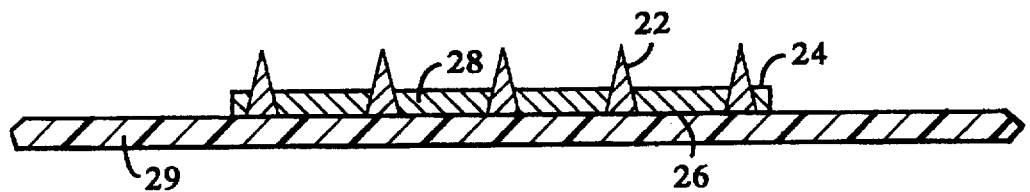
FIG. 2 is a side view of the preform of FIG. 1.

The present invention will now be described in greater detail with reference to the drawings. The sheet material according to the present invention is shown in FIGS. 1 and 2 as a preform 20. As shown, the preform 20 is a sheet member 21 comprising conductive adhesive members 22 which extend from the top surface 24 to the bottom surface 26 of the sheet member. The preform 20 is supported on a plastic release film 29. All of the area between the conductive adhesive members 22 is composed of a non-conductive adhesive region 28 which electrically insulates each of the conductive adhesive members from each other. As shown, conductive adhesive members 22 extend slightly above the top surface 24 of the non-conductive adhesive region 28. This helps ensure that the tops of the conductive adhesive members make intimate contact with the contact pads on the element or device to be bonded. When the preform 20 is attached to a surface of an electronic element or device for which it has been designed, the raised tops of the conductive adhesive members make first contact with the electical connections to that element or device and flow slightly to wet and form intimate contact with the electrical pads on the element. A fraction of a second later, the non-conductive region of the preform comes in contact with the surface and the complete region between the release film and the surface becomes an essentially void-free adhesive of uniform thickness.

While FIGS. 1 and 2 show a preform 20 which contains a substantially equally spaced array of conductive adhesive members 22, the particular pattern employed will depend upon the size and location of the electrical contact pads on the surface of the electrical device which is to be bonded by the preform. Also, while FIGS. 1 and 2 show the preform as a rectangle, the preform may be square or of any other shape which will correspond to the surface to which it is to be mounted.

The conductive adhesive members are preferably conical in shape as shown in FIGS. 1 and 2 or dome-shaped (not shown). For both overall reliability and ease of manufacturing, during the sheet material formation the conductive members most preferably have a dome (gum drop) or pointed (Hershey® Kiss) shape. These shapes aid in processing the sheet material when a non-conductive region is deposited after the conductive domes since the elevated top and the sloping top surface help to prevent subsequently provided non-conductive adhesive from completely covering even one conductive adhesive member.

The size of the individual preforms will depend on cost, performance, and manufacturing factors, and the size, pitch, and composition of the specific devices to be bonded. Typical and preferred dimensions, expressed in inches, are generally in the ranges of:

|  | Min–Max (typical) | Min–Max (preferred) |
| --- | --- | --- |
| Preform length | .100–6.0 | .200–3.0 |
| Preform width | .100–3.0 | .100–2.0 |
| Diameter of conductive element | .003–.050 | .004–.030 |
| Height of conductive element | .002–.025 | .004–.014 |
| Thickness, non-conductive epoxy | .001–.010 | .002–.006 |
| Thickness, support film | .001–.008 | .001–.003 |
| Pitch of conductive elements | .008–.200 | .008–.100 |

The physical size and shape of individual preforms will depend upon the actual devices to be connected. The minimum preform length and width are the minimum sizes of most silicon dies or other devices to be bonded. Also, it may be difficult and/or expensive to die cut or otherwise manufacture adhesive preforms smaller than the minimum sizes via the process of Examples I and II. The maximum preform sizes reflect the fact that almost all electronic devices to be bonded are currently less than about 3 to 6" (7.6 to 15.2 cm) in length or width. In any case, the size of the adhesive preform will correspond to the size of the component to be bonded therewith. For ease of manufacturing, a plurality of preforms are commonly manufactured in a single operation by producing a large sheet, e.g. 16"×18" (40.6×45.7 cm) as shown in Example V below.

Conductive element diameter and height are generally a function of the distance between the centerlines of the conductive elements, i.e. the pitch. The diameter should generally be less than about 60% of the pitch to avoid unwanted conductivity in the X and Y directions. The height should generally range from about 125–225%, preferably about 150–200%, of the thickness of the surrounding non-conductive region, while also being less than about 150% of the diameter.

The thickness of the non-conductive region should be greater than about 0.001" (2.5 mm) to provide adequate stress relief between the two surfaces to be bonded. Thermal stress due to a difference in the coefficients of thermal expansion (CTE) between materials is proportional to the difference in CTE's divided by the thickness of the interlayer. Thus a thicker adhesive bond reduces stress, i.e. a 0.0005" thick bond will have a stress which is about 2 to 4 times that of a 0.002" thick bond. A maximum thickness of about 0.010" (0.025 cm) is currently recommended due to heat transfer requirements between the two surfaces. Also it would be difficult to remove the solvent in a reasonable time via the process of Examples I and II for an adhesive layer with a final (dry-film) thickness greater than about 0.010". If a thicker non-conductive adhesive region is desired, for example, either to reduce thermal stresses due to expansion differences or to compensate for non-planarity of one or both surfaces to be bonded, it can be accomplished by several methods without dissolving or contaminating the conductive domes. For example, the solvent content can be reduced to reduce shrinkage during drying. Alternatively, two or more sequential layers of the non-conductive adhesive can be applied with each being dried to remove substantially all the solvent before the next is deposited. A third alternative is to deposit the non-conductive adhesive layer prior to the conductive adhesive members and to do this the non-conductive adhesive should generally contain a thickening agent such as silica, bentonite, or talc to assist in precluding the holes from being filling in prematurely.

While increasing adhesive thickness is one means for reducing thermal expansion stresses between different joined materials, the flexibility of the adhesive may also be increased. This may be accomplished by reducing the $T_g$ and the elastic modulus of the cured adhesive. While $T_g$ and modulus values depend in part upon cure time and temperature, the novolac epoxy resins of Examples I–III below form relatively rigid adhesives in which the $T_g$ is typically over 150° C. and modulus over $10^6$ psi after cure at 160°–180° C. Any conventional methods for flexiblizing adhesive resins may be utilized, since doing so is well known in the adhesives art, but two particularly advantageous techniques are (i) use of lower functionality epoxy resins with curing agents such as dicyandiamid and (ii) addition of an elastomer such as a nitrile rubber or a plasticizer.

Figure 3:
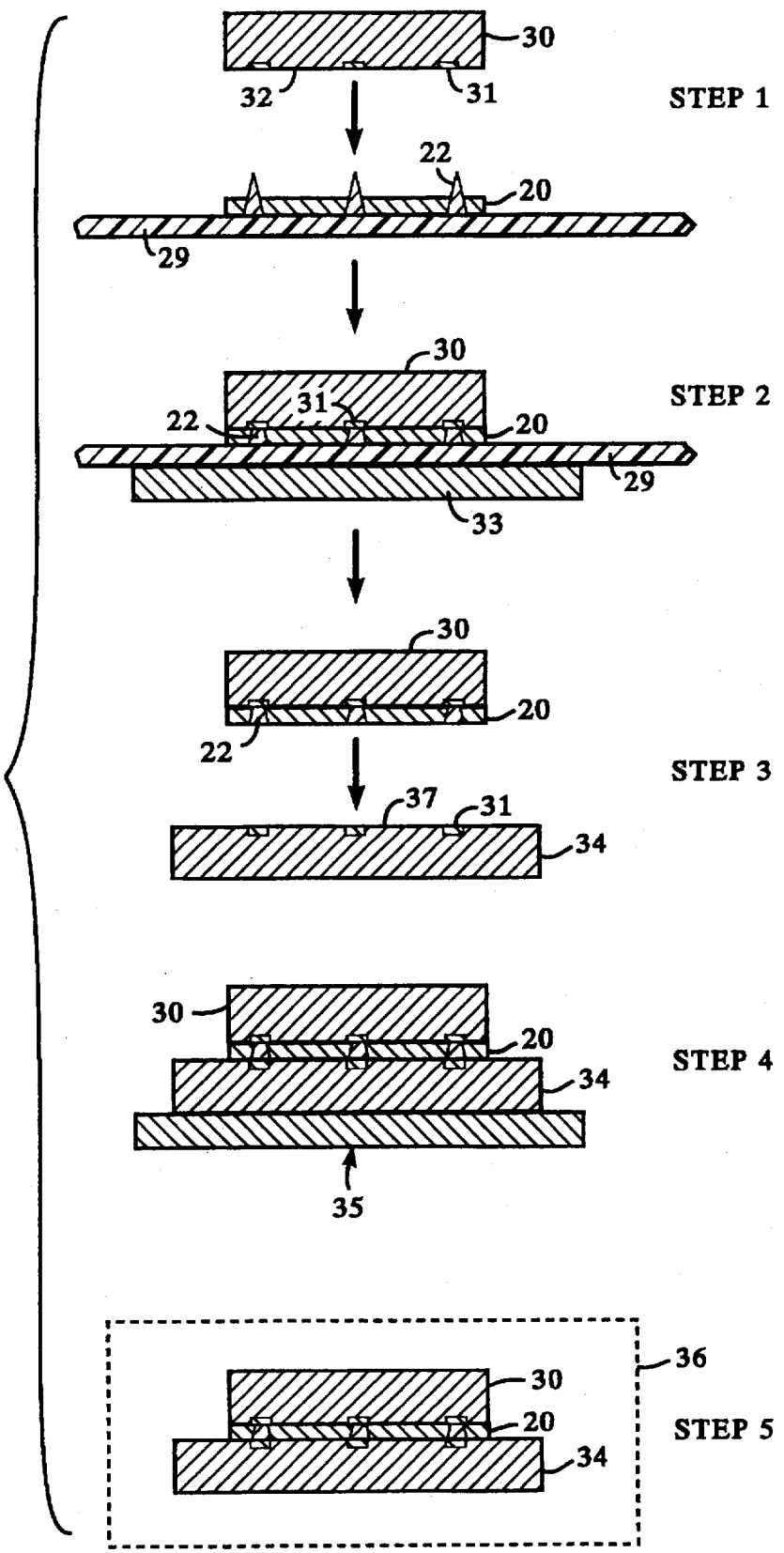
FIG. 3 is a process diagram of the use of the preform of FIGS. 1 and 2.

Release film thickness is limited by the cost and availability of present plastic films and by the fact that films thicker than about 0.008" are not likely to transmit heat rapidly enough for the assembly process shown in FIG. 3.

The minimum pitch is due to one of the uses for the preforms being to area bond flipped chips, i.e. silicon dies face down, to multilayer substrates. The smallest standard distance between bond pad centers of such chips is presently about 0.008" (0.02 cm). While there is no technical reason for a maximum limit on pitch, preforms with a pitch larger than about 0.200" (0.5 cm) have a very low interconnect density, i.e. less than 25 per square inch, and this few number of connections can be made by other less expensive methods. The preferred maximum of 0.100" (0.25 cm) is a standard pitch for current area bonded electronic devices.

The preforms of this invention comprise an array of conductive adhesive members separated from each other by a continuous non-conductive adhesive region. More specifically both the conductive members and the non-conductive region will be derived from adhesive resin compositions, preferably epoxy resins, each of which contains: (i) a non-volatile adhesive resin portion and (ii) a non-volatile filler portion. In addition there may be small amounts remaining of a volatile solvent which has been used during manufacture of the preform sheet material. Most of the solvent will have been removed during manufacture but, for ease of manufacturing and use, it may be desirable to allow a small amount of solvent to remain in the preform sheet material until it is actually attached to an electronic device and/or cured.

The non-volatile resin portion of the conductive adhesive members comprises a mixture of adhesive resins, curing agents, and other additives well known to those skilled in the art of formulating solid adhesives, e.g. adhesive tapes, and solid encapsulants, e.g. transfer molding compounds. The specific chemical composition of the non-volatile adhesive resin portion is not important to the present invention and any compatible non-volatile adhesive resin portion may be used herein. Generally suitable adhesive resins for use herein are those which exhibit most of the following characteristics: solubility in an organic solvent; mixability with fillers to form pastes which can be screened or stencilled; dryability to enable easy removal of the solvent; formable into a solid body which is tack-free at room temperature; heat-curable without generation of condensation products to yield high $T_g$ materials. Preferably the complete adhesive resin compositions will (i) be solid at room temperature, (ii) be tack free at room temperature after drying to remove solvent and before cure, (iii) cure at > about 120° C. to form a thermoset or thermoplastic polymer with a glass transition temperature (Tg) > about 70° C., and (iv) have a shelf life of > about 60 days at 0° C.

The choice of a specific system will depend upon the particular manufacturing and operating conditions to which the preform will be subjected. Many such suitable formulations are described in Bolger, J. C., "Structural Adhesives; Today's State of the Art; Chapter 7 of *Adhesive Manufacturing* G. L. Schneberger, Ed.; Marcel Dekker, NY (1983), and in other standard texts on adhesives and encapsulants, particularly epoxy-based systems.

Because epoxy adhesives and encapsulants are so widely accepted by the electronics industry, the currently preferred resins are thermosetting and thermoplastic epoxy resins. Examples of some of the numerous other addition-curing thermosetting resins which, although often more expensive and often requiring higher cure temperatures than thermosetting epoxies, possess the necessary characteristics to be useful herein, include such as: (i) bismaleimide resins made by reacting maleic anhydride with an aromatic diamine, e.g. Keramid® 601 and other Keramid resins from Ciba-Geigy; (ii) triazine resins made from the dicyanate ester of bisphenol-A or other polyhydric phenols, e.g. the cyanate ester resins from such as Ciba-Geigy and Interez, Inc. (iii)

bismaleimide-triazine resins by blending bismaleimides with triazines to make the family of thermosetting resins called "BT" resins, e.g. the BT resins BT-2170 and BT-2100 from Mitsubishi; and (iv) low molecular weight polyimides, e.g. those terminated with acetylene groups such as the Thermid® resins of National Starch. Most of the Thermid resins become thermoset via addition of the acetylene end groups although several of them can be used as high $T_g$ thermoplastics.

In addition, thermoplastic resins may be used in lieu of thermosetting resins. Suitable such resins will generally exhibit reflow and bonding after exposure to temperatures above about 150° C. A few examples of such resins include many of the high molecular weight polyamide and polyester resins now used in hot melt adhesives. Other examples of specific thermoplastic resins useful herein include: styrene-butadiene block co-polymers, e.g. the Kraton® resins of Shell Chemical; polysulfone resins, e.g. the Victrex® resins from BASF Corp.; and so-called thermoplastic polyimides in which the polyimide has been modified to reduce its melting point to permit use as a hot melt adhesive. Examples of thermoplastic polyimides include the resins made per U.S. Pat. No. 4,652,598, the subject matter of which is incorporated herein by reference, in which about 10% of the aromatic diamine is replaced by a silicone diamine, and the LARC TPI thermoplastic polyimide made from benzophenone tetracarboxylic acid di-anhydride (BTDA), described by St. Clair et al. at NASA for use as adhesive binder resins.

By use of thermoplastic adhesives, strong adhesive bonds can be formed very quickly and simply by melting the adhesive between two flat parallel surfaces and then cooling to room temperature. The bodies being joined by a thermosetting adhesive are merely tacked together after the second attachment is made (FIG. 3, Step 4) and must thereafter be placed in an oven or some other heating device to complete crosslinking and cure. In contrast, thermoplastic adhesives do not require a subsequent heat cure.

Although use of a flexible thermoplastic or thermosetting adhesive can reduce thermal stresses in the final product, such reductions in $T_g$ and modulus may have major disadvantages. A rigid (high $T_g$) adhesive is generally preferred to improve resistance to swelling, corrosion or other failure of adhesive bonds during exposure to heat and humidity, as in long term exposure at 85° C./85% RH or in pressure cooker tests (at 121° C./15 psi steam). High $T_g$ is also preferred to avoid excessive softening when the adhesive is exposed to high temperatures either due to solder reflow or in operation. As a result, there is a need to balance different properties in the selection of the adhesive resins. While it is currently preferred that the $T_g$ of the adhesive compositions be greater than about 70° C., it is understood, however, that the use of more flexible resin compositions, i.e. having a lower $T_g$, are intended to be within the scope of this invention since they can easily be made using the procedures disclosed herein and may be adequate for certain applications in which heat and humidity exposure will not be demanding.

Preferably, the major ingredients in the non-volatile resin portions are solid epoxy resins derived from bisphenol-A, bis-phenol-F, phenolic novolacs, and other epoxy resins as described in U.S. Pat. No. 3,356,645. Also present will be curing agents or curing agent mixtures such as dicyandiamid; phenolic novolac resins; acid anhydrides such as pyromellitic dianhydride (PMDA), benzophenone tetracarboxylic acid di-anhydride (BTDA) or polysebacic polyanhydride; aromatic polyamines such as diaminodiphenylsulfone or various imidazoles or blocked imidazoles as described in such as U.S. Pat. No. 4,066,625 and in trade literature such as "The Curezol Series of Imidazole Curing Agents for Epoxy Resins," Shikoku Chemical Corporation, Tokyo, Japan. Such imidazoles may be used as the sole curing agent for epoxy resins but, most frequently, they are used in small quantities as accelerators to speed the reaction between the epoxy resins and the other curing agents listed above and as disclosed in U.S. Pat. No. 3,631,150. The subject matter of each of the U.S. patents is incorporated herein by reference. In any case, the curing agents should be used in close to stoichiometric amounts for extended shelf life and cure as specified below.

Other additives, such as small quantities of liquid adhesive resins, flexibilizers, surfactants, or coupling agents such as silanes may also be added as is well known in the adhesives art. While the non-volatile resin portion must be such that the resulting adhesive compositions after drying for solvent removal must be solid and tack-free at room temperature, liquid resins, liquid curing agents, and other non-volatile liquid additives may be used.

Although not critical to the present invention, the non-volatile resin portion should have a shelf life of at least about 60 days when stored at 0° C. Shelf life is the storage period during which the mixture remains useful as an adhesive; i.e. the period during which it does not gel or advance in cure to such a point that it loses its flow and adhesive properties. Suitable shelf life is present when, after having been stored for 60 days at 0° C., the non-volatile resin portion can be used as an adhesive between two metal surfaces, each 1 cm×1 cm in area, to exceed the shear strength requirement of 2.5 Kg per MIL Std. 883B after heat cure above 120° C.

The non-volatile resin portion of the non-conductive adhesive region may be identical to the resin portion in the conductive members or the two portions may be chemically different, since the physical requirements of both portions are the same. The primary difference between the chemical composition of the conductive epoxy members and the non-conductive epoxy region is the type of filler. For the conductive elements, the filler is a highly electrically conductive metal such as silver, copper, gold, nickel, or mixtures thereof, as well as copper-nickel alloys, silver-plated copper particles, gold-plated nickel particles, and the like. The filler, in the form of fine particles or flakes, will normally have a maximum particle size of less than about 50 µm, preferably less than about 40 µm. Also the filler will have an average particle size of less than about 10 µm, preferably less than about 5 µm, as measured by ASTM B-330-82. Most preferably, the conductive metal filler will be silver flake. The weight ratio of the conductive metal filler particles to the non-volatile resin portion of the conductive members will depend upon the specific gravity of the materials. For silver or gold, the weight ratio of metal to the balance of the composition is generally between about 7:1 and about 1:1, preferably between about 5:1 and about 3:1, to ensure the provision of sufficient electrical conductivity to the composition. The use of such fillers to impart electrical conductivity to epoxy adhesives is well known. At a 4:1 ratio each "dot" of conductive adhesive 0.004" in diameter and initially 0.008" thick will commonly contain more than 1,000, preferably more than 2,000 highly conductive metal particles.

Although the non-conductive adhesive region might conceivably contain no fillers, most frequently it will contain particles of one or more non-electrically conducting powders such as aluminum oxide, silica, zinc oxide, diamond powder, boron nitride, and other fillers which will serve to reduce the thermal coefficient of expansion and to increase the thermal conductivity of the electrically non-conductive region. When used, such fillers should have a maximum size of less than about 50 μm and an average particle diameter of about 0.5 to 30 μm, preferably of about 1 to 20 μm, and may be present at a filler to non-volatile resin weight ratio between about 1:5 and about 3:1.

To prepare the preforms, the non-volatile resin portion of the adhesive members is substantially dissolved in suitable volatile organic solvents. The volatile solvents enable the non-volatile resin and non-volatile filler to form a thixotropic paste by dissolving the resins and essentially all of the other organic ingredients in the non-volatile resin portion to yield a composition having a viscosity suitable for screen printing, e.g. at 25° C. between about 20 and 8000 cps. By "essentially" all other ingredients is meant that certain curing agents, such as dicyandiamid or imidazoles, which may be present in minor quantities, e.g. less than about 15 wt %, may remain suspended in the resin paste as finely divided powders. This is done for well-known shelf life and cure rate reasons. The volatile solvent needs to be easily removable from the thixotropic paste. For example, when a 5 mil thick layer of the paste solution is spread on a metal plate, at least 90 wt % of the total solvent should evaporate when the plate is heated to about 80° C. for about 15 minutes. Suitable solvents include low boiling organic solvents such as methylethylketone or other ketones, toluene or other aromatics, $MeCl_2$ or other chlorinated solvents, ethyl acetate or other esters, isopropanol or other alcohols, or mixtures of these solvents. Higher boiling solvents such as butyl cellosolve acetate may also be added to minimize too rapid dry-out during manufacture.

Both the vertical conductive members and non-conductive adhesive region compositions may additionally contain a mesh material embedded therein. The mesh material, when used, is preferably a woven or non-woven mesh onto and through which the adhesive compositions are applied during the manufacturing process. The mesh, preferably a fiberglass mesh, then remains as an integral portion of the final adhesive preform structure. The use of the mesh is described in detail below with reference to the manufacturing process.

The process for producing the electrically conductive sheet material and preforms generally comprises forming conductive adhesive circuit lines, when used, and conductive adhesive members on a release film in the desired patterns and thereafter forming a non-conductive adhesive region over the conductive adhesive circuit lines and between each of the conductive adhesive members by applying a non-conductive adhesive composition to the release film, thereby forming the sheet material. The sheet material may then be cut into the desired shape and size to form a preform.

More specifically, the first step in the manufacturing process comprises the use of some type of pattern forming device such as a screen or a stencil and onto a flexible high melting (>160° C.) plastic release film such as Mylar® polyester film of DuPont which is positioned on a flat surface. Whether a screen or stencil is used depends on factors such as the conductive circuit line width and droplet size and spacing. As used herein, a stencil is a thin sheet of metal such as brass with holes which have been drilled or etched therein to allow a quantity of an adhesive paste to pass through the open areas. A screen is a grid of wires with cerain areas blocked by an emulsion or other means and with the remaining areas open to permit passage of an adhesive paste. Generally, a screen is used for the circuit lines, a stencil is for the droplets when the holes comprise a small portion of the surface area, and a screen for the non-conductive region when most of the area is open.

Prior to passing the conductive adhesive for the conductive adhesive members or the non-conductive adhesive for the non-conductive adhesive region through the screen or stencil, a fiberglass or polymeric, e.g. nylon or polyester, mesh may be applied to the top surface of the release film. The mesh, which may be woven or non-woven, may serve to improve the dimensional stability, i.e. prevent stretching, of the preform it is first attached to a single surface. When used, the mesh is preferably an open weaved mesh of from about 0.5 to 1.5 mils thick. If a glass mesh is used it may optionally be pre-sized by a conventional procedure such as by dipping it into a dilute thermosetting epoxy resin dissolved in a solvent such as methylethylketone, then drying and heat-curing the epoxy. The use of size is optional with a fiberglass mesh but helpful in reducing porosity in glass fiber bundles and to improve stiffness and handling of the tape. Generally no size is needed for nylon or polyester mesh materials. Typically, such sizing adds 5 to 40% cured resin to the weight of the fiberglass.

After passing through the screen or stencil, the conductive adhesive composition is deposited onto the release film or, when a mesh is used, on the mesh weave touching and through to the release film. The conductive adhesive circuit lines are substantially flat having a thickness of about 1 mil. The conductive adhesive droplets generally have a conical or domed shape, tapering away from the release film. The so-formed conductive adhesive circuit lines and members are then heated to remove substantially all of the solvent therein, i.e. dried, at a temperature below the cure or gel temperature of the adhesive being used to form hard solid shapes.

The next step in the process is to form the non-conductive adhesive region between each of the conductive adhesive members previously formed. This is preferably accomplished by either of two methods. The first method involves passing the non-conductive adhesive composition through a reverse screen to that used to form the conductive members and positioned over the release film so that the areas directly above the previously formed conductive adhesive members or droplets are blocked so as not to permit the non-conductive adhesive to cover the conductive droplets. The second method comprises applying the non-conductive adhesive directly to the release film by spraying or curtain coating, or other suitable means. When employing either technique, care must be taken to minimize/avoid covering the tops of the previously formed conductive adhesive members with the non-conductive adhesive composition.

Alternatively and as shown in Example III, the order of deposition of the conductive members and non-conductive region can be reversed. Still further alternatively and as shown in Examples III–V, multiple depositions of the non-conductive adhesive may be made to increase the overall thickness of the final non-conductive adhesive region. Still further alternatively and as shown in Examples VI–VIII, conductive circuit lines may be deposited prior to either of the adhesives.

After applying the non-conductive adhesive, the sheet material so formed is heated to a temperature below the gel temperature of the adhesive resin employed to remove substantially all of the volatile solvent. Typically the temperature is below about 120° C. in an air-circulating oven, to yield a sheet material which is a solid at room temperature. If more than one application of non-conductive adhesive is used, heating will occur after each application. When the final desired structure is produced, the sheet material may then be cut into preforms of suitable size and shape by standard techniques known in the art. The preforms which remain on the release film are now ready for use.

The use of the preforms to electrically and physically attach together two electronic devices 30 and 34 is demonstrated in FIG. 3. As shown in Step 1, an individual preform 20 of uncured, essentially solvent-free, solid adhesive resin supported by a flexible polymeric release film 29 and having electrically isolated conductive members 22 is pressed against surface 32 of device 30. The preform 20 and the device 30 are aligned such that each of the conductive epoxy members 22 in the preform are aligned with conductive pads 31 on surface 32. As shown in Step 2, the preform is then heated by, for example, a heated surface 33 to a temperature above the softening temperature of the preform but below its curing temperature, typically about 70°–150° C. for thermosetting epoxies for about 1–10 seconds. A small but uniform contact pressure, typically from about 0.1 to 20 psi, is also applied during the heating to help the preform 20 wet the surface 32 and form intimate interfacial contact with it. The pressure may be applied by conventional "pick and place" equipment such as is manufactured and sold by K & S Corporation of Horsham, Pa. Higher pressures should generally be avoided during this initial tacking step to prevent lateral flow within the melted preform which could lead to electrical contact between adjacent contact pads. While longer contact times and/or higher temperatures are generally undesirable for thermoset resins because either could lead to premature gelation or cure, such will often be necessary for thermoplastic resins which require temperatures above about 150° C. for reflow and bonding.

After tacking the preform to the surface of one device, the structure is cooled so that the epoxy resins will substantially re-solidify. At this point, with the preform 20 tacked to device 30 and with the opposite side of preform 20 still on the release film 29, the structure may be stored for future use. Alternatively, it may be directly used to make electrical and physical contact with a second device or element 34.

As shown in FIG. 3, Step 3, after removing the device and preform from the release film, the preform side is pressed against the top surface 37 of a second device 34 such that the conductive elements in the preform align with the conductive pads 31 on surface 37. The assembly is then heated by contact with a heated surface 35 or by other such means, under light pressure, to tack the preform 20 to the second device 34. The heat and pressure are applied under substantially similar conditions as those which were used to tack the preform 20 to the first device 30.

The assembly is then ready for accomplishing final cure of the thermosetting resin adhesive preform as shown in Step 4. This may be performed by transfering the assembly from the tacking fixture to a second heating device, such as an oven 36, for final cure at a temperature of from about 120° to 220° C., preferably from about 150° to 180° C. Alternatively and for thermoplastic resins, the assembly may be left in the pressure tacking fixture and the temperature increased to about 150° to 250° C. to cause final cure/bond. If any pressure is applied during the final cure cycle, care must be taken to preclude any combination of temperature plus pressure which would cause lateral flow within the preform before gelation of the resins occurs. In any case, the higher the cure temperature, the shorter will be the time required for final cure. Typical cure times will range from about 2 to 6 hours at 120° C. to about 30 minutes to 2 hours at 160° C. to about 1 to 20 minutes at 220° C.

The adhesive preforms of the present invention are particularly useful in the assembly of electronic devices as noted above. Variations of the assembly process to generate simpler or more complicated electronic components are all intended to be within the scope of this invention.

The adhesive preforms are useful with dies (chips) which have bond pads arranged along 4 edges (edge bonded) or distributed over the entire area (area bonded) of one surface. The edge bonded dies may be attached to a substrate either by wire bonds or by the conductive adhesive preforms of this invention. The area bonded dies may be attached by conventional solder bumps or by the conductive adhesive preforms of this invention. The die(s) may be protected by conventional encapsulation methods or they may be protected by a metal lid as described in Examples VII–X below which have a solid adhesive resin, preferrably epoxy, encapsulant preapplied to one side. When this encapsulant is heated and placed against the die side of the above chip carrier, the adhesive resin flows and then cures to completely encapsulate the die(s) and to permanently bond the metal lid to the die(s) and substrate.

The adhesive preforms can be used to permanently attach a flipped chip to a mounting substrate as shown in Example VI below. The adhesive preforms can be used to permanently attach a chip-containing substrate to a larger mounting surface such as a circuit board or mother board, independent of the means of electrically connection of the chip to the first substrate, i.e. be it by wire-bonding, a preform adhesive of this invention, or any other means. Furthermore, adhesive preform sheets based on the principles of this invention may be generated to not only accomplsh attachment of dies to substrates but also to provide internal electronic connections within more complicated electronic devices, such as multi-chip arrays and laminated multi-chip modules.

Specifically, adhesive preform sheets can be produced which will not only provide an electrical pathway in the Z direction as discussed in detail above but also in the X and Y directions to route the electrical signals from the die surface to the opposing surface which is connected to the circuit board. The X or Y electrical pathways can be provided as part of the preforms of this invention by depositing a thin layer (about 1 mil) of a conductive adhesive paste in the design of the desired electrical circuit line upon the release sheet. The electrical circuit is generated on the release film prior to a deposition of the conductive adhesive dots which provide conductivity in the Z direction and/or the non-conductive region. In view of the fineness of the electrical circuit being printed or screened on the release film, the reinforcing mesh (when used) is best placed atop the electrical circuit lines rather than below. Particular details of forming the circuit lines are shown in Examples VI–XI below. The result of this process is a novel chip carrier.

The invention will now be described with reference to the following examples which are meant to be illustrative but not limiting. All parts and percents are by weight unless otherwise specified. Mils are used throughout this document to refer to thousandths of an inch. Examples I–V show the making and use of adhesive sheet materials with conductive regions only in the vertical, Z, axis to attach pad array chip carriers and other components to circuit boards. Examples VI–XI demonstrate the preparation and use of adhesive sheet materials in accordance With the present invention which provide electrical paths in the X, Y, and Z, directions to permit the manufacture (not just the attachment) of low cost pad array chip carriers, multi-layer substrates, laminated multichip modules (MCM-L's), and the like.

EXAMPLE I

Conductive thermoset adhesive paste A was prepared from the following ingredients, in parts by weight:

| Epoxy novolac resin (Dow QX3310) | 100 |
| Solvent - Butylcellosolve acetate | 72 |
| Phenolic curing agent (CIBA-HY9690) | 45 |
| Imadozole curing agent (Shikoku 2Phz) | 0.7 |
| Solvent - methyl ethyl ketone | 130 |
| Silver flake (Metz SilFlake 25) | 800 | by dissolving the epoxy resin and phenolic curing agent in butylcellosolve acetate by warming to 70° C. and stirring in a roll jar. After cooling to room temperature, the imadazole powder and then the methyl ethyl ketone were added to make a low viscosity solution having a viscosity of 650 cps at 25° C. Then the silver flakes (pre-screened through a 325 U.S. mesh screen to remove material > about 40 μm) was added, first by simple stirring and then by passing the mixture twice through a 3 roll mill to produce a smooth, thixotropic paste. The silver flakes had a reported average particle size of 1.8 μm prior to the pre-screening. The paste had a composition by weight as follows: non-volatile epoxy resin portion=12.6%, non-volatile filler portion (silver)=69.5%, volatile solvents=17.9%. After drying to remove the volatile solvents, the final conductive epoxy members had a composition of about 84.6% silver and 15.4% epoxy resin.

A non-conductive adhesive paste (NC-A) was prepared from the following ingredients, in parts by weight:

| Epoxy novolac resin (Dow QX3310) | 140 |
| Phenolic Curing Agent (CIBA-HY9690) | 70 |
| Epoxy resin (Shell EPI REZ 565) | 65 |
| Imadozole curing agent (Shikoku 2Phz) | 1.6 |
| Solvent - methyl ethyl ketone | 300 |
| Carbon black filler | 0.6 |
| Aluminum oxide filler powder | 200 | by dissolving the two epoxy resins and phenolic curing agent in all of the methylethyl ketone by jar rolling for 16 hours. The imadazole powder, the carbon black (average particle size of < 1 μm), and the aluminum oxide powder (pre-screened through a 325 U.S. mesh screen, average particle size of <20 μm), were blended into the epoxy resin solution by means of a propeller stirrer. The resulting supension was very fluid and, because the filler particles tended to settle after mixing, the mixture was re-stirred to re-suspend the fillers just before use. The non-conductive epoxy composition contained: non-volatile epoxy resin portion=35.6%, non-volatile filler portion=25.8%, volatile solvent=38.6%. After drying to remove the solvent, the final non-conductive epoxy region had a composition of about 58.2% epoxy resin and 41.8% non-conductive filler.

A surface treated Mylar release film, 2 mils thick, was placed on a flat surface. Using a brass stencil, with an 11×11 matrix of 121 circular openings, with each opening approximately 20 mils in diameter and with the holes on 100 mil square pitch, a droplet pattern of Conductive Paste A was squeezed through the holes and deposited on the Mylar surface. The droplets were dried, but not gelled or cured, by heating in an air circulating oven for 10 minutes at 80° C. to remove most of the solvents. After drying, the droplet height was about 10 mils.

Then a 100 U.S. mesh stainless steel screen with a pattern of blocked circles corresponding to the droplet locations on the Mylar film was carefully positioned so that the blocked circles on the screen, each approximately 20 mils in diameter, were located above the droplets of the conductive adhesive. The non-conductive adhesive NC-A was then screened through the open areas to deposit a layer of non-conductive adhesive between the conductive epoxy droplets. The film and the two epoxy mixtures thereon was then heated at 80° C. for 10 minutes to remove the methylethyl ketone from the non-conductive epoxy and to convert a wet film thickness of about 5–6 mils into a dry film thickness of about 2–3 mils.

The sheet material of electrically isolated conductive epoxy adhesive members separated by the non-conductive epoxy adhesive region on the release film was then kiss cut into 1.2" squares, corresponding to the size of a test circuit device. Kiss cutting entails using a metal die to cut through a top layer, i.e. the epoxy sheet, without cutting through a bottom layer, i.e. the release film. Excess sheet material was then removed to leave a 1.2"×1.2" preform on the film.

A test device was prepared from a 2 mil thick conventional Kapton circuit film by drilling 121 holes each 0.015" in diameter therein, filling each of those holes with a silver filled epoxy and then curing the epoxy to provide 121 conductive vias through the Kapton film.

The preform was then aligned so that the 121 conductive dots of the preform were in register with the 121 via terminations on one side of the test device. The preform was tacked to the test device by heating the preform under an applied force. The heating was performed by pre-setting a hot plate to 160° C. and the force was applied by placing a 300 gram metal plate, 1.5" by 1.5", atop the test device. A total residence time of about 4 to 5 seconds on the hot plate was sufficient to cause the temperature at the interface between the test device and the preform to be about 100°–130° C. for about 2 seconds. These conditions melted the epoxy resins in the preform and produced an essentially void-free contact at the interface. The circuit device and preform were removed from the hot surface and allowed to cool to room temperature. The Mylar film was then removed by peeling it away, leaving the preform in contact with the circuit device. This structure was then aligned, epoxy adhesive side down, on a printed circuit board substrate having the same 121 circuit contact points, pressed together for about 3 seconds at 100° C. as described previously, and then placed in a 160° C. oven for 60 minutes to cure both epoxy compositions.

When tested electrically, all 121 conductive via terminations on the top side of the test circuit film were connected electrically to circuit lines on the PC board surface. Ohmmeter readings showed the average resistivity through the individual preform conductive elements to be less than 0.1 ohms.

EXAMPLE II

A sheet of plastic release film, melting above 150° C., such as surface treated Mylar, was placed on a flat surface. Over this was laid and held down a strip of open weave fiberglass mesh tape. The fiberglass tape (glass mesh A) had previously been sized by dipping into a conventional size of a dilute thermosetting epoxy adhesive solution in MEK, followed by drying and heat curing of the epoxy size.

A stencil, having the same 11×11 hole pattern described in Example I, was used to deposit a dot pattern of a conductive silver-filled epoxy on glass mesh A. The epoxy was essentially the same as that of Example I except that the silver content was reduced from 800 to 730 parts. This reduced the viscosity of the paste and enhanced the flow of the epoxy droplets into the fiberglass mesh to touch through to the release film. Most of the solvent was removed by drying the deposited epoxy paste at 80° C. for 10 minutes to yield dome-shaped silver-filled epoxy droplets about 20 mils in diameter and 10 mils high embedded in and precisely spaced on 100 mil rectangular pitch in glass mesh A.

Then a solution of the non-electrically conductive epoxy thermosetting adhesive of Example I, except that the methylethylketone content was increased from 300 parts to 500 parts, was sprayed over glass mesh A, such that this second epoxy solution flowed down and around the dome shaped conductive members and completely filled in the spaces between the domes. Several seconds after spray-applying the non-conductive epoxy, the entire surface was lightly sprayed with only MEK solvent to wash the tops of the conductive epoxy adhesive domes, helping to remove any small amounts of non-conductive epoxy which may have remained from the first spray. The sheet was then dried for 10 minutes at 80° C., cooled to room temperature and kiss cut into preforms, as in Example I.

The resulting preform was evaluated as in Example I and when tested electrically, all 121 conductive via terminations on the top side of the Kapton test device were connected electrically to circuit lines on the PC board surface.

EXAMPLE III

Glass mesh A was stretched out and held down on a Mylar release film as in Example II. The non-conductive adhesive composition of Example I (NC-A) was thickened by adding 2 parts colloidal silica and reducing the methylethyl ketone (MEK) content from 300 to 150 parts. This paste was then applied through the blocked 100 mesh stainless screen of Example I to yield a wet film about 7 mils thick continuous everywhere except under the 11×11=121 circular areas which were blocked by the screen leaving the fiberglass exposed. The wet film was dried to yield a solid epoxy layer 3 to 4 mils thick. The blocked screen was then re-positioned and a second layer of non-conductive adhesive NC-A was deposited and dried. The final non-conductive region had a thickness of 7 to 8 mils and the 121 circular holes were open and free of any adhesive.

An Asymtek Corp. Model 402 Automove shot dispenser was then used to inject a droplet of the silver-filled conductive epoxy of Example II into each of the 121 holes. The shot dispenser was computer programmed to dispense a precisely metered volume of adhesive through a metal tube, at pre-set positions, and at a rate of over 100 shots per minute. After drying at 80° C., the conductive epoxy adhesive was found to have impregnated the mesh, flowed through to the underlying release film, and formed dome-like shapes about 10 mils high.

EXAMPLE IV

A linear, high molecular weight resin can be made from essentially equimolar quantities of epichlorohydrin and bisphenol-A (Epi- Rez® 565 of Shell Chemical). Although commonly referred to as "thermoplastic epoxies," these resins contain essentially no epoxy (i.e. oxirane) groups. But their molecular weight is high enough to form high strength adhesive bonds at room temperature with a $T_g$ of about 85°–95° C. and a melting point of about 160° C. Such a thermoplastic resin can be used as an adhesive in this invention by melting it between two surfaces and then cooling to room temperature.

One part Epi-Rez® 565 was dissolved in 0.5 parts butyl cellosolve acetate (BCA) and 1 part methylethylketone (MEK). A thermoplastic conductive adhesive composition was prepared by adding nonylphenol plasticizer and silver flake to produce a composition containing 20 parts resin, 1 part nonylphenol, 30 parts solvent, and 72 parts silver. A non-conductive adhesive composition was produced by adding the alumina of Example I and colloidal silica as in Example III such that the non-conductive thermoplastic composition contained 20 parts resin, 1 part nonyl phenol, 24 parts solvent, 15 parts alumina and 0.2 parts silica.

The procedure of Example I was repeated to apply the conductive mixture to form the dot pattern. The dots were dried at 80°–100° C. The blocked 100 mesh stainless steel screen was then used to apply the non-conductive mixture which was dried at 80°–100° C. Then a second layer of non-conductive mixture was applied using the same blocked screen in the same position and dried to yield a sheet material with 121 conductive domes, each about 8 mils high surrounded by a non-conductive region about 5 mils thick. A preform, about 1.2"×1.2" (3×3 cm), containing the conductive dots, was cut out for use in the thermal test fixture made as described below.

A 1.2"×1.2"×20 mil thick square of alumina, with a coefficient of thermal expansion (CTE) of about $7\times10^{-6}$/°C. had a circuit pattern of interrupted conductive lines on one surface. A FR-4 (fiberglass-epoxy) board with a CTE of about $17\times10^{-6}$/°C. had a complementary circuit pattern on one surface. The two circuits were such that when the surfaces were joined using the above adhesive preform the 121 elements were electrically connected in series. When the assembled fixture is cycled from high to low temperature, resistance measurements between the line terminations can detect a failure as soon as a single conductive element produces an open circuit due to fracture or loss of adhesion.

To assemble the fixture, the thermoplastic preform was first pressed against the alumina surface as shown in FIG. 3, Step 1, except that a higher temperature (180° C.) was required to soften the thermoplastic preform. The second bond to the FR-4 circuit board was made as shown in FIG. 3, Step 4, except that the substrate was heated via the hot plate 35 to a temperature of about 180° C. while a pressure of about 20 psi was maintained for about 5 seconds. The bonded assembly was cooled to room temperature and required no further curing operation.

The alumina to FR-4 assembly was cycled between +100° and –40° C. All bonds remained conductive after 4 thermal cycles.

EXAMPLE V

Figure 4A:
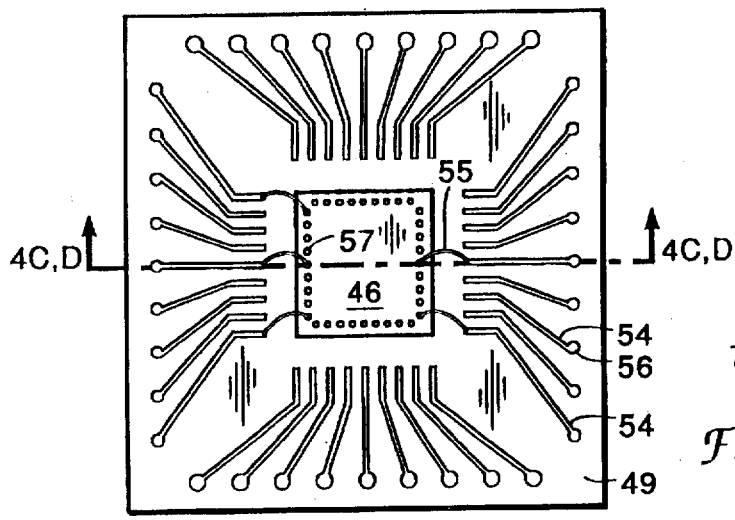
FIG. 4A is a top view of a conventional circuit board in a pad array chip carrier which is wire bonded to a substrate having fan-out lines.
Figure 4B:
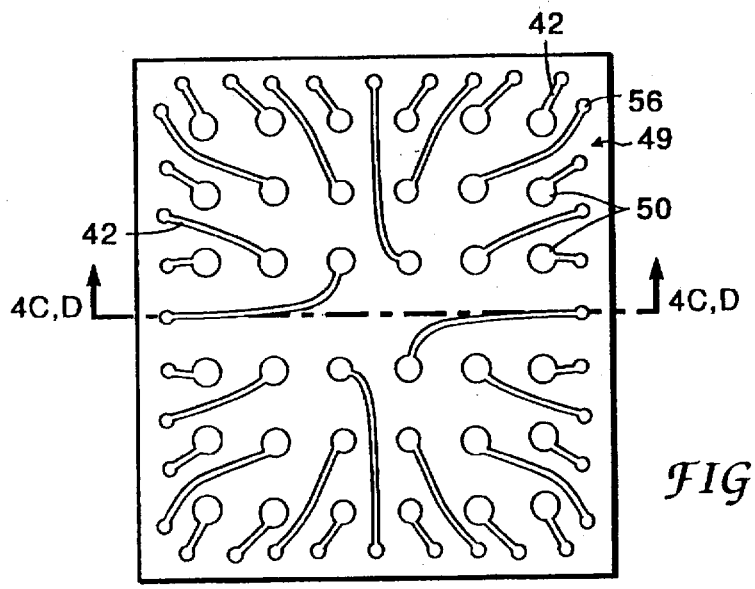
FIG. 4B is a bottom view of the circuit board in a pad array chip carrier of FIGS. 4C and D.
Figure 4C:
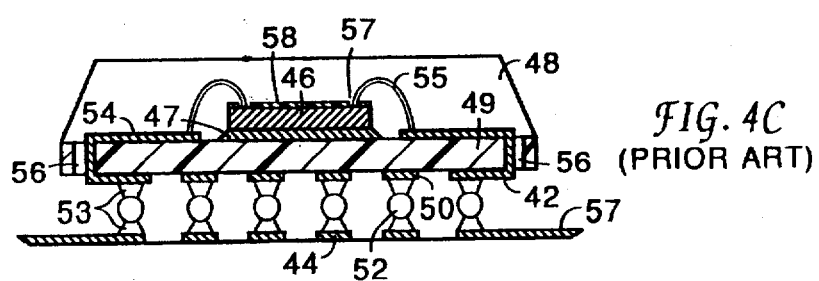
FIG. 4C is a side view of the pad array chip carrier of FIGS. 4A and 4B taken through line 4C,D—4C,D after encapsulation and connection to a mother board by means of prior art solder balls.

This example shows the use of an epoxy resin and containing additives which reduce the $T_g$ of the cured resin compositions to about 110° C. It further shows the use of a conductive adhesive preform to replace solder in the attachment of pad array chip carrier (PAC) to a mother board by the procedure as generally shown in FIG. 4. Referring to FIG. 4, the specific PAC shown is a plastic PAC which contains a silicon die 46 attached to a fiberglass epoxy circuit board 49 using a conventional epoxy die attach adhesive 47 (FIG. 4A). The chip is then encapsulated using a conventional transfer molded epoxy resin 48 over the die and the top of the circuit board. While FIG. 4 shows a single die, the same techniques can be used to attach two or more dies to a circuit board 49 to make a multichip plastic PAC. These packages are called pad array chip carriers because the bond pads 50 which form the connections to the mother board 51 are arrayed in a two-dimensional grid pattern over the bottom surface of the package. Conventionally as shown in FIG. 4C, the bond pads 50 are connected to the board 51 by use of a tin-lead eutectic solder paste 53 which attaches high melting solder balls 52 with a diameter of about 1 mm between opposing pads on surfaces 50 and 51. The solder balls 52 serve to separate the two surfaces in an attempt to avoid solder joint cracking during thermal cycling. Such PAC's are currently being produced in large volume by Motorola under the name OMPAC (over molded pad array carrier because of the molding compound above the die), Amkor under the name BGA (ball grid array packages), and by others. The method shown in FIGS. 4A, B and C may also be used to make ceramic pad array carriers by replacing the plastic board 49 and encapsulant 48 with a ceramic substrate and cover such as alumina.

The PAC of FIG. 4 utilizes a complicated electrical path from the die pads 57 to the pads 44 on the mother board 44. The PAC contains an expensive circuit board 49 with copper lines 54 and 42 on the top and bottom surfaces respectively. The circuit board 49 further contains drilled and plated through holes 56. The die 46 is attached to the board 49 with a conventional silver-filled epoxy adhesive 47. Electron flow is from the die 46 through the die pads 57, through the gold wires 55, through the top circuit lines 54, down through the plated holes 56, through the bottom copper lines 42, to the gold-plated copper bottom pads 50. The bottom surface around the pads 50 has a solder resist coating to confine the solder during reflow. From the pads 50, electron flow continues down through a first tin-lead eutectic solder joint 53 on the circuit board 49 to a high melting tin-lead solder ball 52 and then through a second eutectic solder joint 53 to a gold plated pad 44 on the mother board 51.

Figure 4D:
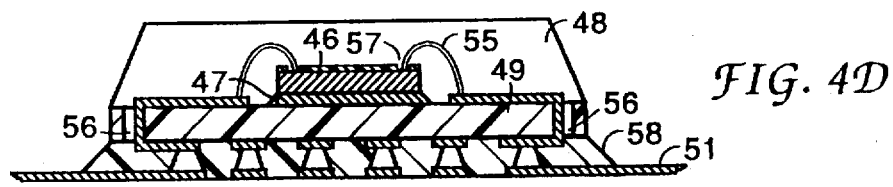
FIG. 4D is a side view of the pad array chip carrier of FIGS. 4A and 4B taken through line 4C,D—4C,D after encapsulation and connection to a mother board by means of an adhesive preform of the present invention.

FIG. 4D shows the use of an adhesive preform of this invention to replace the solder paste, the solder balls and, optionally, to avoid any need to gold plate, solder mask, or otherwise modify the copper pads on either surface. Conductive adhesive C was made by combining:

| | |
|---|---|
| Solid bisphenol-A epoxy resin, epoxy equiv = 550 | 100 parts |
| Liquid bisphenol-A epoxy resin, epoxy equiv = 190 | 10 parts |
| Pulverized dicyandiamid powder | 5 parts |
| Pulverized imidazole accelerator (Shikoku 2PHZ) | 3 parts |
| BCA solvent | 30 parts |
| Xylene solvent | 20 parts |
| MEK solvent | 30 parts |
| Silver flake | 590 parts |

The dicyandiamid (dicy) powder was mixed at high shear into the liquid resin. The solid epoxy resin was dissolved in the MEK and BCA solvents and combined with the dicy paste and the other ingredients, first by simple stirring and then by roll milling to form a smooth thixotropic paste, containing about 11% solvent, 15% resin solids, and 74% silver. After solvent removal and cure at 170° C., the above paste yields a conductive epoxy adhesive containing about 83.3% by weight silver and has a $T_g$ of about 110° C.

A second dicy-cured adhesive (non-conductive paste C) was made from the following ingredients in parts:

| | |
|---|---|
| Solid bisphenol-A epoxy resin, epoxy equiv = 550 | 100 |
| Liquid bisphenol-A epoxy resin, epoxy equiv = 190 | 21 |
| Pulverized dicyandiamid powder | 6 |
| Imidazole accelerator, Shikoku 2PHZ | 3 |
| CTBN (liquid nitrile rubber, B. F. Goodrich) | 6 |
| Thermoplastic epoxy resin, Epi-Rez 565 | 30 |
| Aluminum Oxide, per Example I | 120 |
| Boron nitride powder, -325 U.S. mesh | 20 |
| Colloidal silica (Cabot Corp.) | 2 |
| BCA solvent | 20 |
| Xylene solvent | 20 |
| MEK solvent | 20 |

The dicy powder was mixed into 12 parts of the liquid resin. The remaining 9 parts of the liquid resin were heated at 100° C. with the carboxy-terminated butyl nitrile rubber (CTBN) to react the carboxy groups and form an epoxy-terminated adduct thereof. The thermoplastic epoxy and the solid resin were dissolved in the solvents and then combined with the other ingredients to yield a smooth thixotropic paste with a solvent content of about 16.6%, resin solids about 44% and filler content about 39.2%. After solvent removal followed by heat cure at 170° C., the mixture forms a very high strength, thermally conductive, electrically non-conductive epoxy adhesive with a $T_g$ of about 105° C.

While FIG. 4 shows 36 pads on the PAC, the actual PAC used had 15 rows of pads, 15 pads per row, for a total of 225 pads arrayed on a metric pitch of 1.5 mm. A brass stencil was made matching the pads with each hole 0.4 mm in diameter. Separately, a 100 mesh stainless steel screen was made with arrays of 225 blocked areas each about 0.5 mm in diameter. The screen and stencil so made were each held in a metal frame about 17 inches long and 12 inches wide. The frames had indexing holes to enable them to be very precisely positioned within a deHaart Model EL-20 semi-automatic screen printer.

Since each of the above 225 dot square patterns is only about 2.1 cm square, it is inefficient for production quantities to make a 17"×12" screen or stencil to print just one such 225 dot pattern. The screen and stencil were therefore made with 48 patterns each, i.e. 6 rows of 8 patterns, each pattern consisting of 225 dots on 1.5 mm pitch and pattern separated from the next pattern by 1 cm. Thus, one pass with the stencil deposits 48 patterns each with conductive 225 dots for a total of 48×225=10,800 dots. One pass with the blocked screen deposits a non-conductive adhesive coating over the entire printing area, continuous except for 10,800 circular voids with each void position corresponding exactly to a hole position in the stencil.

The basic procedure of Example I was repeated starting with a Mylar release film and glass mesh A. The stencil was used to apply the 48 patterns of the conductive adhesive and the resultant dots were dried at 80° C. The blocked screen was then positioned to apply the non-conductive adhesive everywhere except over the dots. The non-conductive epoxy adhesive was dried at 80° C. A second layer of non-conductive epoxy adhesive was applied using the screen and then dried at 80° C. to yield a final sheet material about 7"×10" in area containing 48 dot patterns, each of which had 225 dots on 1.5 mm pitch. The conductive dots were about 8 mils high and the surrounding non-conductive adhesive was about 5 mils thick.

The sheet was removed from the printing frame and slit into 6 strips with each strip containing 8 dot patterns. The strips were passed through a kiss cutting machine to cut through the adhesive layer but not through the Mylar release film. The excess adhesive material was peeled away to leave 8 epoxy preforms on each Mylar strip. Each preform had the appearance of the single preform shown in FIGS. 1 and 2 and was 2.5 cm square with a distance between the preforms of 1.0 cm. For large volume production, it will be advantageous to kiss cut the adhesive tapes into preforms arranged in regular order on the release film.

Plastic test PAC's constructed as in FIG. 4 were obtained from Motorola Corp. but with the 225 gold plated copper pads 50 interconnected within the package to form half of a daisy chain pattern. Compatible fiberglass epoxy thermal test circuit boards were also obtained from Motorola having 225 pads 44 interconnected to form the other half of the daisy chain. When the test PAC is attached to the test circuit board, either conventionally by the solder paste and solder balls as shown in FIG. 4C or by the adhesive of this invention as shown in FIG. 4D, the 225 contacts become connected to form 6 circuit paths plus one ground path. Each circuit path contains from 20 to 50 connections in series. By measuring the current flow between the ground line and the end of any of the 6 circuit paths, the conductivity of the joints can be measured and it can be determined if any of the 225 connections is broken or fails to conduct current for any reason.

The test plastic PAC was bonded to the thermal test board by first tacking the PAC to a preform as in FIG. 3, steps 1–3, using a surface heated to 120° C. The preform was then attached to the board as in FIG. 4, step 4, but with one difference. The general procedure of FIG. 3 would be satisfactory if both surfaces being joined by the adhesive preform were reasonably flat and parallel. However, the test PAC's were not flat. They had convex bottom surfaces because the molded top 48 had shrunk more than the circuit board 49. The lack of planarity is currently a serious problem with plastic PAC's, and makes such PAC's difficult to surface mount with solder.

For this example the process of FIG. 3, step 4, was modified to hold the parts between two heated plates, rather than just against one plate. The top plate (not shown in FIG. 3) was at 180° C. and the bottom plate was at 160° C. Clamping pressure was 20 psi. The heated top plate served to expand the epoxy encapsulant to remove the convex bow from the bottom of the PAC. After 60 minutes between the two heated plates, the bonded part, as shown in FIG. 4D, was removed and cooled to room temperature.

Electrical measurements across the 6 daisy chain paths found that all 225 joints were conductive, with an average reading of about 0.05 ohms, an excellent value for a conductive adhesive. There were no shorts between any joints. The bonded assembly showed no deterioration in electrical performance after 200 hours in an 85° C./85% RH humidity chamber. After 100 hours in a pressure cooker at 15 psig/121° C. steam, the adhesive showed no deterioration. Testing of additional adhesive-bonded PAC's prepared as above exhibited no joint failure after 20 cycles from +160° C. to −40° C. The same thermal cycling test commonly causes failure of the currently used solder joints with plastic PAC's. The attachment strength for the adhesive bonded PAC was measured by applying a shear force to one edge. At 25° C., a shear force of over 200 kg was required, at which point the test circuit board broke and delaminated while the adhesive remained intact. A conventional soldered PAC is sheared off the same board at less than 30 kg shear force by cracking across the solder joints.

EXAMPLE VI

The plastic PAC of FIG. 4 is more expensive to manufacture than a conventional edge soldered molded plastic package because the PAC requires a complicated electrical path from the contact pads on the die to those on the circuit board. This example shows how one adhesive preform of this invention can be used to not only attach the die but also to make all of the necessary electrical connections from the die pads to the pads on the circuit board.

To attach a 184 lead, edge bonded, silicon die, there are 184 die pads for which electrical connections need be made. To accomplish this a 15×15 grid array having 225 available grid positions was selected. Of these, 184 grid positions are connected to the die while the remaining 41 positions are not.

Figure 5A:
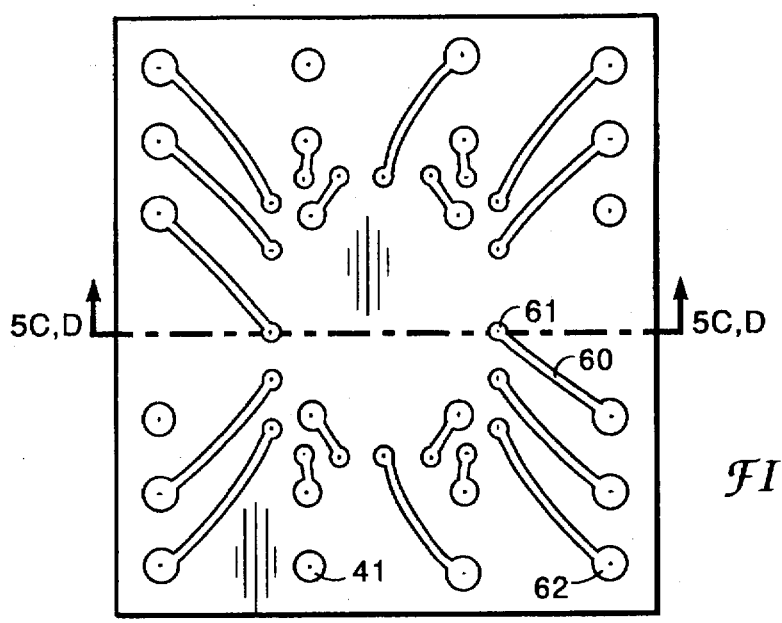
FIGS. 5A and 5B are bottom and top views, respectively, of an adhesive preform of this invention.

To form the electrical connections, first a 325 mesh screen was made with openings to print the fan-out circuit pattern of which FIG. 5A is representative thereof. The pattern consists of 184 circuit lines 60 (about 0.1 mm wide) which extend between small circular pads 61 (about 0.12 mm in diameter) and larger pads 62 (about 0.5 mm in diameter). The smaller pads 61 vary in spacing but have a minimum pitch of 0.2 mm. The larger pads 62 are located in a 15×15 row grid array on a standard metric pitch of 1.5 mm.

Figure 5B:
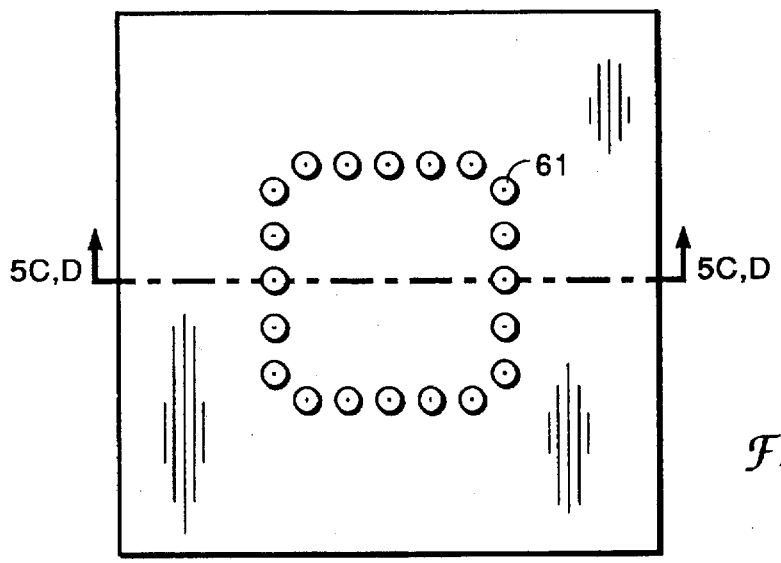

The circuits were formed by printing conductive adhesive paste D (Table I) through the screen directly onto a Mylar release film. After drying at 80° C., the conductive patterns as shown in FIG. 5A were about 1 mil thick each. Glass mesh A 65 was stretched out over the dried pattern on the Mylar and then dots of conductive paste E (Table I) were stencilled over the mesh using a brass stencil having 184 holes each about 0.11 mm in diameter arranged in the pattern as shown in FIG. 5B. The stencil was aligned so that the conductive paste flowed through the mesh to form dots which coincided with the small pads 61 of FIG. 5B. The dots were dried at 80° C. Conductive pastes D and E are similar to each other and to the pastes of the previous Examples, differing primarily in filler and solvent quantities. Conductive Paste D, used to print circuit lines through a 280 to 325 mesh screen has more silver and more slow drying solvent than Conductive Paste E, which was stencilled to form dots. All of the pastes are tack free at room temperature after being applied in a thin film and dried at 80° C. for 15 minutes.

TABLE I

Compositions of Conductive Pastes D and E and Non-Conductive Paste E, in parts by weight

| | Conductive Paste D | Conductive Paste E | Non-Conductive Paste E |
|---|---|---|---|
| Epoxy novolac resin Dow DEN 438 | 100 | 100 | 100 |
| Liquid Bis-A Epoxy | 33 | 33 | 33 |
| Phenolic Curing Agent Ciba HY 9690 | 60 | 60 | 60 |
| Imidazole powder, U.S. 4,066,625 | 1 | 1 | 1 |
| Silver flake filler | 960 | 770 | 0 |
| Aluminum oxide, per Example 1 | 0 | 0 | 133 |
| Boron nitride powder | 0 | 0 | 33 |
| Colloidal silica, Cabot Corp. | 0 | 0 | 3 |
| Solvents: BCA | 70 | 33 | 42 |
| MEK | 30 | 46 | 39 |
| Xylene | 37 | 16 | 0 |

Figure 5C:
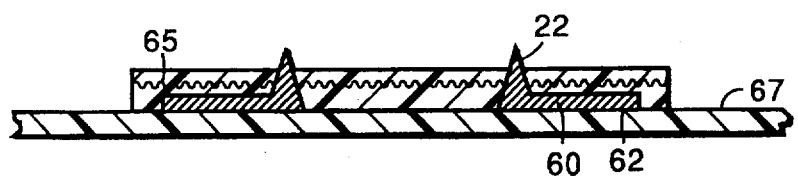
FIG. 5C is a side view of the adhesive preform of FIGS. 5A and 5B taken through line 5C,D—5C,D.

A 120 U.S. mesh screen was made having 184 blocked areas each about 0.12 mm in diameter corresponding to the positions 61 in FIGS. 5A and 5B. The screen was then aligned to deposit non-conductive adhesive paste E between each of the conductive dots. After drying at 80° C., the resulting product is shown in FIG. 5C. The top surface of the resulting adhesive preform has a conductive dot pattern exactly corresponding to the 184 bond pads of the die. The conductive dots are each about 5 to 6 mils high with a bottom diameter of about 5 mils. The non-conductive region is about 3 mils thick.

Figure 5D:
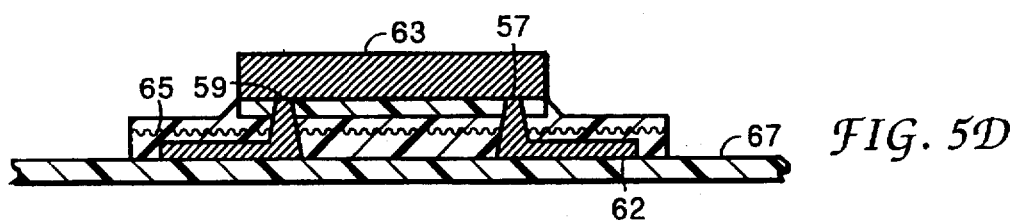
FIG. 5D is a side view of the adhesive preform of FIGS. 5A and 5C taken through line 5C,D—5C,D with a die attached.

The silicon die was "flipped", i.e. placed face down, so the top of each conductive dot contacted a die pad 57. The flipped die was pressed gently against the preform which was heated to about 90° C. by placing a hot plate (not shown) against the bottom surface of the Mylar film 67 to thereby attach the die to the preform as shown in FIG. 5D.

The die is then ready for storage or further processing as desired. It can be stored on the uncured preform with the Mylar release film attached as shown in FIG. 5D or it can be sent directly for encapsulation, cure, attachment to a circuit board, or the like, as in Example VII.

EXAMPLE VII

This example makes use of an area bonded die of the type which has been used in large computers for many years. Area bonded dies are processed by metalizing aluminum bond pads on the die surface by sputtering a thin layer of chromium, then copper, and then gold thereover. The dies are then flipped and soldered to a multi-layer ceramic substrate by forming solder joints to the metallized pad areas. While there are major electrical performance advantages for area bonded dies vs. the edge bonded dies of Examples I–V, prior to this invention there was no practical way to area bond flipped chips in plastic PAC's or in MCM-L's.

Referring to FIG. 6, an area bonded die 83 (18×14 mm×0.45 mm thick) with 184 metallized bond pads irregularly distributed over the top surface with a minimum spacing between pad centers of 0.4 mm was used. FIG. 6A shows a simplified lay-out for a fan-out circuit layer for the area bonded die. The actual circuit for a 184 lead die is more complex. Routing the various signal, ground, and power lines generally requires more than one circuit layer to permit cross-overs and fan-out from the center, but this example merely illustrates a construction method which utilizes the adhesive preforms of this invention to accomplish the electrical interconnection.

Figure 6A:
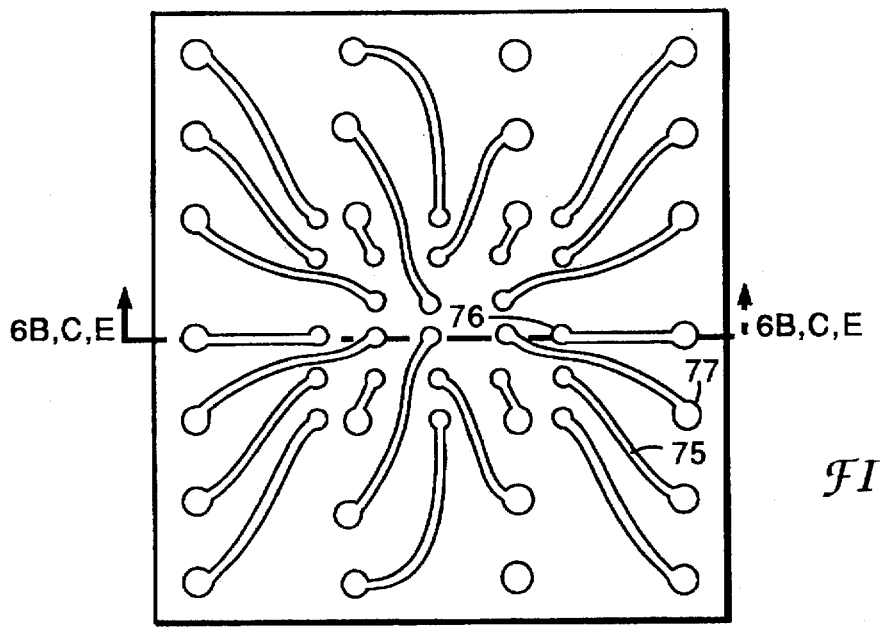
FIG. 6A is a bottom view of a further preform of this invention.

To prepare the adhesive preform of this example, a 325 U.S. mesh screen was formed with open areas corresponding to the circuit pattern of FIG. 6A. There were 184 circuit lines 75 each about 0.12 mm wide, each connecting a 0.15 mm diameter small circular pad 76 to a larger 0.4 mm diameter pad 77. The larger pads were located at 184 of the 225 possible grid positions in a 15×15 row array on 1.5 mm pitch, described in Examples V and VI. Conductive paste D was applied directly on a Mylar release film 67 using the screen (not shown), to produce the circuit pattern of FIG. 6A. After drying at 80° C., the conductive adhesive pattern was about 1 mil thick. Glass mesh A 65 was then stretched out directly over the dried circuit pattern. A brass stencil was made with 0.14 mm holes at the positions of the small pads 76 in FIG. 6A and a 100 U.S. mesh screen was made with blocked areas 0.15 mm in diameter, corresponding to the same positions of the small pads 76. Conductive paste E was applied through the stencil to form conductive dots and dried at 80° C. Then non-conductive paste E was applied around the conductive dots through the blocked screen and dried at 80° C. The resulting preform had conductive dots 6 mils high and about 7 mils wide at their bases. The non-conductive region had a thickness of about 3 mils. The area bonded die 83 was then flipped and attached to this preform in accordance with the procedure of Example VI.

To encapsulate the die and produce a finished PAC, a 10 mil thick strip of annealed copper was stamped to form cavities and then cut into 26×26 mm squares 81. The cavities were formed by steel inserts in the male half of a stamping press, each insert being just slightly larger than the size of the die. The cavities were made just slightly larger than the die to maximize heat transfer from the die to the lid while precluding the die from coming into electrical contact with the metal lid. The copper squares were cleaned and then coated on the side opposite the cavity with a thin (<1 mil) coating of an epoxy varnish (not shown) to resist oxidation. Non-conductive adhesive E was impregnated into glass mesh A and dried to give a tape adhesive about 3 mils thick.

Figure 6B:
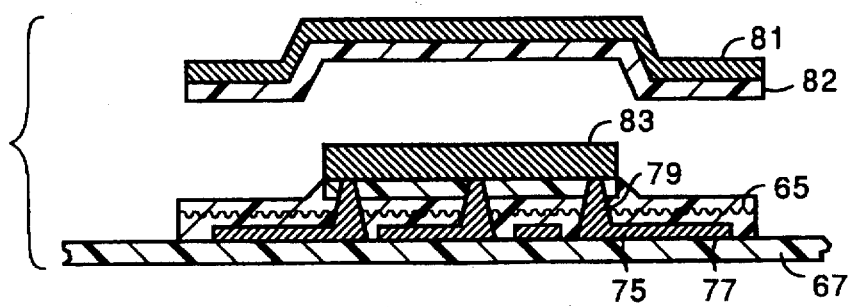
FIG. 6B is an exploded side view of chip carrier of this invention in which the preform of FIG. 6A, taken through line 6B,C,E—6B,C,E, is on a release film, has a die attached thereto, and has an unattached cover.

The tape was cut into squares 82 slightly larger than 26×26 mm and as shown in FIG. 6B tacked to the cavity side of the copper lids 81 by gentle heating and pressure.

To produce the chip carrier, the lids 81 with epoxy 82 were placed on one side of a clamshell heating fixture. The Mylar release film strip 67 was positioned on the opposing side of the fixture. Normally, the Mylar strip would hold 6 or more precisely located dies on preforms. The clam shell heater surface was set at 160° C. After about 5 seconds of preheat in the open fixture, the clam shell rack was closed, placing the preheated lids on the preheated dies and preforms to produce the encapsulated die and form the void-free package of FIG. 6C. After about 10 seconds, the clam shells were opened and the PAC's still on the Mylar strip 67 are ready to be placed in an oven or other heating device for final cure at about 165° C.

After cure, the finished PAC's were removed from the Mylar strip and tested for electrical performance, using standard test probes and burn-in fixtures. After removal from the Mylar film, the circuit of FIG. 6A is exposed on the flat bottom surface 78 and thus the bond pads 77 are readily available for electrical testing and quality control.

For brevity, the copper topped PAC's of FIG. 6C will here be called CU-PAC's (pronounced "cue-pacs") to distinguish them from the aluminum topped AL-PAC's of Example VIII below and the plastic PAC's (P-PAC's) and ceramic PAC's (CER-PAC's) of Example V. The CU-PAC's and AL-PAC's are stored and shipped exactly as is done with currently used P-PAC's and are attachable to circuit boards as previously described in Example V with an adhesive preform 58 (shown in FIG. 6D) made per Example V. The final CU-PAC mounted on a circuit board 104 is shown in FIG. 6E.

Note that the only difference between making the XYZ axis adhesive preforms of Examples VI and VII, and the Z axis adhesive preform of Example V was the addition of a first step of printing a conductive adhesive circuit pattern on the Mylar sheet release film before placing the glass mesh thereon.

Figure 6C:
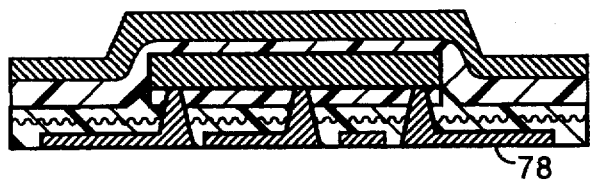
FIG. 6C is the chip carrier of FIG. 6B with cover attached and removed from release film.
Figure 6D:
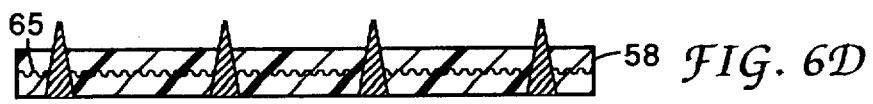
FIG. 6D is a side view of an adhesive preform of this invention suitable for adhering the chip carrier of FIG. 6C to a circuit board.
Figure 6E:
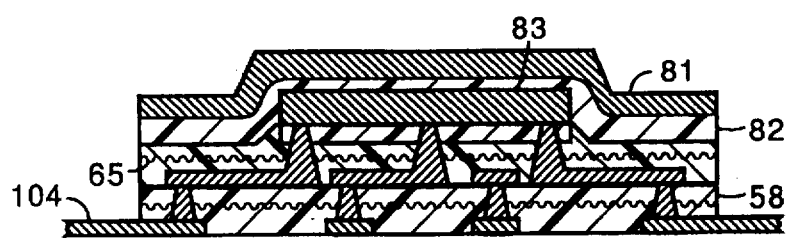
FIG. 6E is a side view of the chip carrier of FIG. 6C attached to a circuit board via the the preform of FIG. 6D.

The resulting CU-PAC of FIG. 6C has major cost and performance advantages over present P-PAC's since it contains only a die, an inexpensive piece of stamped copper, and 2 squares of adhesive preform, one per this invention and one a conventional non-conductive adhesive. It is therefore much less expensive than a P-PAC which contains the expensive circuit board of FIG. 4, plus the die attach adhesive 47, the gold wires, the molded epoxy encapsulant 48 and the need to gold plate or solder mask the PAC and the mother board surfaces. The CU-PAC also eliminates the need for any type of solder, including both eutectic solder joints and tin-lead balls. The elimination of lead solder has cost, shock resistance, reliability, as well as environmental, advantages. The metal lids gave a more rugged, less moisture sensitive chip carrier than the plastics used in P-PAC's, and the metal lids were much more efficient in removing heat from the die. The bottom surfaces of CU-PAC's or AL-PAC's were flatter, i.e. have more planarity, than the bottom surfaces of most P-PAC's.

EXAMPLE VIII

The procedure of Example VI is repeated except that the copper lids 81 as shown in FIG. 6B were replaced by aluminum sheet, 8 mils thick, and the epoxy varnish was omitted. The resulting chip carriers performed identically and the aluminum lids maintained an attractive metallic appearance even when heated in air above 160° C., a temperature at which uncoated copper would oxidize.

EXAMPLE IX

The procedure of Example VII was repeated except that the non-conductive adhesive tape used to form the attachment means for the copper cover was not used. It was replaced by epoxy composition F, which contains a fused quartz filler to provide a lower CTE, which was made by combining:

| | |
|---|---|
| Epoxy novolac resin ECN 1273 (Ciba-Geigy) | 85 parts |
| Liquid bisphenol epoxy, Epox Equiv. 190 | 15 parts |
| Phenolic curing agent CIBA HY 9690 | 50 parts |
| Imidazole powder accelerator | 0.9 parts |
| Amino silane coupling agent | 0.6 parts |
| Fused quartz, size between 1 and 30 mm dia. | 327 parts | by dissolving the resins in the solvents of Example I, mixing in the fillers, and then applying to the inside of the lids. The amount deposited in the lids was such that after solvent removal, the dry thickness of the adhesive material was about 3 mils. Epoxy composition F re-melts at about 90° C. and then cures at about 160°–180° C. and yields a high $T_g$ low CTE adhesive and electronic-grade encapsulant.

EXAMPLE X

The procedure of Example VIII was repeated except that the solvents were omitted from epoxy composition F. The ingredients of epoxy composition F were dry blended, passed through a compounding extruder, and then ground to a powder with particle size between about 40 and 325 U.S. mesh. The powder was then be applied to the inside of the metal lid and melted to yield a final average thickness of 3 to 4 mils.

EXAMPLE XI

Examples VII–X used epoxy-filled metal lids to encapsulate area-bonded flipped chips. The same lids were also be used to encapsulate the wire bonded chips of Example V, in the so-called chip-on-board method, as shown in FIG. 4 where a bare die 46 has been wire bonded to a circuit board 49. Conventionally, this encapsulation is done either by overmolding with a transfer molded epoxy or, more frequently, by applying a large drop or "blob" of a liquid epoxy "blob top" encapsulant over the wire bonded die and then heat curing.

To utilize the epoxy-filled metal lids of Examples VII–IX with the face-up wire-bonded chips of FIG. 4, the lid cavity used was made larger and deeper, to avoid contact with the gold or aluminum wires 55. The other modification was that more epoxy was applied within the cavity, i.e. typically an amount to form a layer about 5 to 20 mils thick, in order to fill the volume above the die and around the bond wires. But the general process for applying the lids over a wire bonded die was the same as described in Example VII. The lid was preheated to above about 150° C. to melt the epoxy and then placed gently over the wire bonded die. It generally took about 5 to 10 seconds for the melted epoxy to flow around the wires, expel all the air, and form a seal to the circuit board or other mounting board surfaces. The assembly was then ready for placement in an oven for final cure at 150°–180° C.

EXAMPLE XII

Frequently, several area bonded dies are attached to a single multi-layer substrate, i.e. a mounting surface which contains several underlying circuit layers, to form a multi-chip-module. The large computers referred to in Example VII contain ceramic multichip modules, MCM-C's, each with 10 or more dies attached to an alumina substrate with 10 or more interconnected circuit layers. This example extends the printing method of Examples VI and VII to the formation of electrically interconnected multilayer adhesive preform sheets with conductivity in the X, Y, and Z directions, for use either in the single chip PAC's of Example VII or in the laminated MCM-L's described herein.

While it is possible to simply make two or more adhesive sheets per Example VI which are dried (but not cured) and then stacked and cured as a whole to form a multilayer solid structure which is within the scope of this invention, a more efficient way of accomplishing the result is by forming the multiple layers by repeating the screening and stenciling steps as best shown in FIG. 7.

FIG. 7 shows a simplified lay-out for an MCM-L with 4 chips. In FIG. 7B four arrays of small circles 90, 95, 96 each representing a connection to a die pad, are shown. The lines 91 and 92 represent connections between the dies. Some circles 95, 96 represent vertical connection vias which connect to other vias. The other circles 90 represent vias which go down and then fan out to a larger pitch to connect with an underlying substrate or mother board. The die bond pads of FIG. 7B are close together, typically on minimum pitch of 0.4 mm. The vias from the bond pads 90 must therefore be re-distributed or "fanned out" to connect with the more widely spaced pads 94 below. FIGS. 7A, C and D show the substrate pads 94 on the same 1.5 mm standard pitch used in previous examples.

Figure 7A:
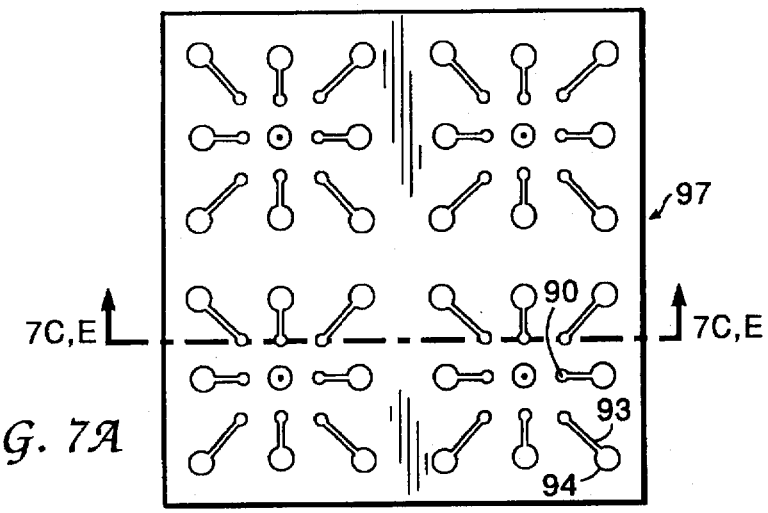
FIG. 7A is a bottom view of an additional adhesive preform of this invention.
Figure 7B:
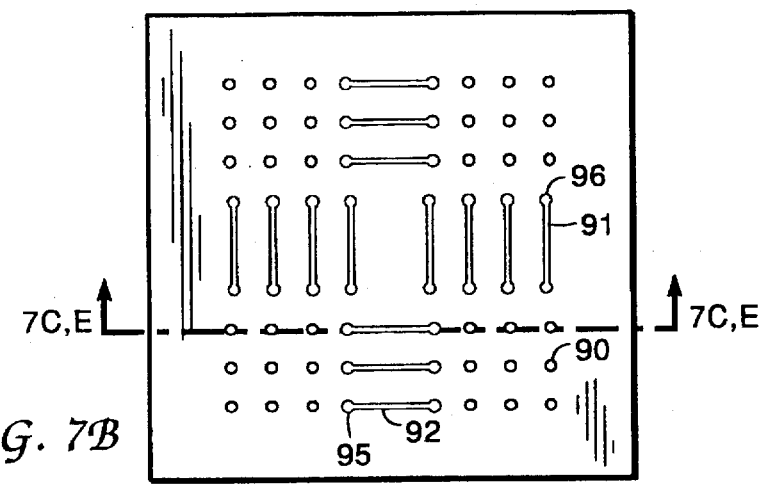
FIG. 7B is a bottom view of an additional adhesive preform of this invention which is formed atop the adhesive preform of FIG. 7A and thus shows the internal circuit layer between the two preform layers of FIG. 7C.

A series of stencils and stainless steel screens were made for the circuits of FIGS. 7A and 7B. Screens A and C were made from 325 U.S. mesh. Screens B and D were made from 120 U.S. mesh:

Screen A: Open areas per the fan-out patterns of FIG. 7A.

Stencil B: 0.16 mm holes per the small circles, 90, of FIG. 7A.

Screen B: Blocked areas per the small circles, 90, of FIG. 7A.

Screen C: Open areas per the lines 91, 92 and circles 95, 96 of FIG. 7B.

Stencil D: 0.14 mm holes per all of the circles of FIG. 7B.

Screen D: Blocked areas per all of the circles of FIG. 7B.

Note the distinction between the circles 90, which connect to the large pads 94 in FIG. 7A and the circles 95 and 96 which connect to the Y axis 91 or X axis lines in FIG. 7B. For brevity in the description below, EC paste means electrically conductive paste and NC paste means non-conductive paste. The sequence started by placing a Mylar release film in the printing apparatus. Then use:

1. Screen A. Apply EC paste D to Mylar. Dry.
2. Apply layer of glass mesh A.
3. Stencil B. Apply EC paste E. Dry.
4. Screen B. Apply NC paste E. Dry.
5. Flatten as necessary. See below.
6. Screen C. Apply EC paste D. Dry.
7. Apply layer of glass mesh A.
8. Stencil D. Apply EC paste E. Dry.
9. Screen D. Apply EC paste E. Dry.
10. Remove from printer and cut into preform with dimensions 97, FIG. 7b.

Figure 7C:
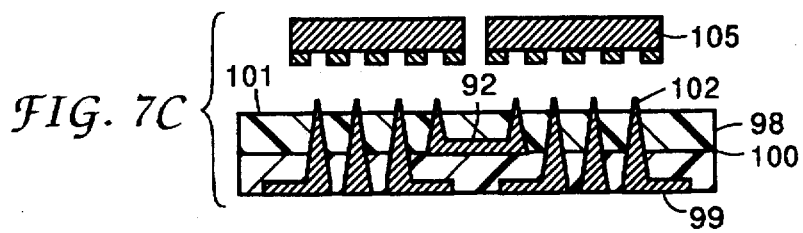
FIG. 7C is an exploded side view showing the use of a two-layer adhesive preform containing the circuit patterns of the preforms of FIGS. 7A and 7B, taken through line 7C,E—7C,E, after deposition of the respective conductive dots and non-conductive regions and prior to chip attachment.
Figure 7D:
FIG. 7D is a side view of an adhesive preform of this invention suitable for adhering the cured structure of FIG. 7C to a circuit board.
Figure 7E:
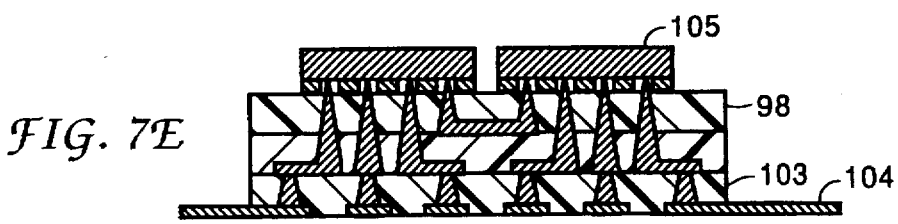
FIG. 7E is a side view of the cured structure of FIG. 7C adhered to a circuit board via the adhesive preform of FIG. 7D.

The result of this sequence of steps was a two-layer adhesive preform 98 of FIG. 7C. The bottom surface 99 contains the fan-out circuit of FIG. 7A. The inner surface 100 contains the interconnections in the X direction 95, 92 and the Y direction 91, 96. Above the top surface 101 are the conductive adhesive members to make the contacts to the four area bonded dies 105.

In reality, however, area bonded dies have many more pads than are shown in FIG. 7 and more than two circuit layers will commonly be required in a complete preform 98. Several X and Y layers would probably be needed, rather than the one XY layer 100 of FIG. 7C. Such additional layers can be made by the method of this invention by making the appropriate additional screens and stencils and then by repeating steps 5 through 9 above as often as necessary.

The only new procedure from the previous Examples is Step 5. It is generally desired to keep the conductive members, 102 in FIG. 7C and 22 in FIG. 2, projecting slightly above the top surface of the adhesive sheet to improve electrical contact to the die or other part to be bonded thereto. But to build up multiple layers by the above procedures, a relatively smooth surface is desired to print the circuit lines. Step 5, "flatten as necessary," was performed by stretching a thin film of polyethylene over the polished surface of an ⅛" thick aluminum plate which was used to press the film against the then existing adhesive sheet top surface. The plate was removed and then the film was carefully peeled away to leave a smooth, flattened surface.

Each of the layers contains a sheet of the glass mesh. This is optional because the same layers can be formed without the glass mesh as was done in Example I, but the glass mesh is preferred since it increases the mechanical strength of the sheet, helping to make it possible to kiss cut around the edges of a preform and remove unwanted material between preforms. Moreover, the glass mesh serves to decrease the thermal expansion coefficient of the adhesive sheet material after final cure.

Because the 2 layer adhesive sheet of FIG. 7C has a bottom surface 99 which contains the exposed pads 94 on the same 1.5 mm pitch used in Example V, the same adhesive preform sheet 98 can be used to attach the MCM-L to a mother board 104 with pads on 1.5 mm pitch or to another substrate. Final assembly can be performed either by first attaching the dies 105 to the top surface 101 of the two-layer preform 98 and then using the adhesive preform 103 to attach the MCM-L to the mother board 104, or by first joining the two-layer sheet 98 to the adhesive sheet 103 and then adding the dies 105. Final cure in either case is typically performed at about 150° C. to 180° C.

What is claimed is:

1. An electrically conductive adhesive sheet material suitable for use in connecting electronic components together comprising a multiplicity of electrically conductive adhesive members each having a bottom surface and a top surface, each of said members being separated from each other by means of a non-conductive adhesive region disposed between said conductive adhesive members, each non-conductive member having a bottom surface and a top surface, said conductive adhesive members and said non-conductive adhesive region being joined together to form an integral sheet material having a planar bottom surface formed of the conductive and non-conductive adhesive members, with the top surface of each of the conductive adhesive members extending beyond the top surface of each of the non-conductive adhesive members, said conductive adhesive members comprising a first adhesive resin and an electrically conductive metal filler, and said non-conductive adhesive region comprising a second adhesive resin.

2. The sheet material of claim 1, wherein the conductive adhesive members and non-conductive adhesive region after drying (i) are solid and tack-free at room temperature and (ii) cure at greater than 120° C. to form thermoset or thermoplastic polymers with glass transition temperatures (Tg) greater than 70° C.

3. The sheet material of claim 1, wherein the conductive adhesive members are from about 0.002 to 0.025 inches thick.

4. The sheet material of claim 1, wherein the conductive adhesive members are in the form of conical members.

5. The sheet material of claim 1, wherein the conductive adhesive members are in the form of dome-shaped members.

6. The sheet material of claim 1, wherein the non-conductive adhesive region is from about 0.001 to 0.010 inches thick.

7. The sheet material of claim 1, wherein the conductive adhesive members comprise a first adhesive resin filled with electrically conductive filler material selected from the group consisting of silver, gold, copper, nickel, and mixtures thereof; wherein the weight ratio of the filler material to the adhesive resin is from about 7:1 to about 1:1; and wherein the filler material has a maximum particle size of less than 50 µm and an average particle size of about 1 to 30 µm.

8. The sheet material of claim 1, wherein the non-conductive adhesive region comprises a second adhesive resin filled with non-electrically conductive material, wherein the weight ratio of the filler material to the adhesive resin is from about 1:5 to about 3:1, and wherein the filler material has a maximum size less than 50 µm and an average particle diameter of about 0.05 to 30 µm.

9. The sheet material of claim 1, wherein at least one of the first and second adhesive resins is an epoxy resin.

10. The sheet material of claim 1, wherein it has been cured by exposure to heat.

11. The sheet material of claim 1, wherein the bottom surface of the conductive adhesive members and the bottom surface of the non-conductive region include therein at least one circuit line comprised of an electrically conductive adhesive.

12. The sheet material of claim 11, wherein the top surface includes therein a circuit line of an electrically conductive adhesive.

13. The sheet material of claim 1, wherein the conductive member has a height and a diameter, and the nonconductive region has a thickness, and said height is less than 50% of the diameter and the height is from about 125 to about 225% of the thickness of the nonconductive region.

14. The sheet material of claim 13, wherein the height of the conductive adhesive members are of from about 150%–200% of the thickness of the non-conductive members.

* * * * *

UNITED STATES PATENT AND TRADEMARK OFFICE
CERTIFICATE OF CORRECTION

PATENT NO. : 5,667,884
DATED : September 16, 1997
INVENTOR(S) : Justin C. Bolger It is certified that error appears in the above-identified patent and that said Letters Patent is hereby corrected as shown below:

In the Claims:

Claim 13, Col. 28, Line 52: Delete "50%" and insert --150%--

Signed and Sealed this

Thirtieth Day of December, 1997

*Attest:*

*Attesting Officer*

BRUCE LEHMAN

*Commissioner of Patents and Trademarks*